United States Patent [19]

Williams

[11] Patent Number: 5,819,025
[45] Date of Patent: Oct. 6, 1998

[54] METHOD OF TESTING INTERCONNECTIONS BETWEEN INTEGRATED CIRCUITS IN A CIRCUIT

[75] Inventor: Michael John Williams, Riseley, United Kingdom

[73] Assignee: Texas Instruments Incorporated, Dallas, Tex.

[21] Appl. No.: 714,619

[22] Filed: Sep. 16, 1996

Related U.S. Application Data

[63] Continuation of Ser. No. 527,991, Sep. 13, 1995, abandoned, which is a continuation of Ser. No. 106,158, Aug. 13, 1993, abandoned.

[30] Foreign Application Priority Data

Aug. 20, 1992 [GB] United Kingdom ................... 9217728

[51] Int. Cl.$^6$ .................................................... H04B 17/00
[52] U.S. Cl. ................................. 395/183.06; 371/22.3; 395/183.09
[58] Field of Search ......................... 395/183.01, 183.06, 395/183.12, 183.09; 371/22.1, 22.4, 22.6, 25.1, 27, 22.3

[56] References Cited

U.S. PATENT DOCUMENTS

| | | | |
|---|---|---|---|
| 4,791,358 | 12/1988 | Sauerwald et al. | 324/73 R |
| 4,879,717 | 11/1989 | Saverwald et al. | 371/22.3 |
| 4,963,824 | 10/1990 | Hsieh et al. | 324/158 R |
| 5,029,166 | 7/1991 | Jarwala et al. | 371/22.3 |
| 5,084,874 | 1/1992 | Whetsel, Jr. | 371/22.4 |
| 5,172,377 | 12/1992 | Robinson et al. | 371/22.3 |
| 5,175,494 | 12/1992 | Yoshimori | 371/22.3 |
| 5,202,625 | 4/1993 | Farwell | 371/22.3 |
| 5,222,068 | 6/1993 | Burchard | 371/22.3 |
| 5,260,649 | 11/1993 | Parker et al. | 371/22.3 |
| 5,260,949 | 11/1993 | Hashizume et al. | 371/22.3 |
| 5,281,864 | 1/1994 | Hahn et al. . | |
| 5,329,533 | 7/1994 | Lin | 371/22.3 |
| 5,331,274 | 7/1994 | Jarwala et al. | 371/22.3 |
| 5,442,640 | 8/1995 | Bandell, Jr. et al. 321 | 321/21.1 |

FOREIGN PATENT DOCUMENTS

0400876 A2  5/1990  European Pat. Off. ........ G06F 11/26

*Primary Examiner*—Robert W. Beausoliel, Jr.
*Assistant Examiner*—Albert Decady
*Attorney, Agent, or Firm*—Richard L. Donaldson; William B. Kempler

[57] ABSTRACT

A method of testing the interconnections between integrated circuits in a circuit uses latches, respectively connected to the terminals of the integrated circuit, which are connectable in series as a shift register so that a test pattern of bits can be entered into the latches. The pattern of bits is transmitted through the interconnections to other latches and then shifted out of the circuit along the shift register. Discrepancies between the input and output patterns indicate malfunctioning interconnections. The method is extended to apply to a microprocessor in the circuit, the microprocessor having a program that enables it to use its RAM to act as the latches of the other integrated circuits. The program may be stored in on-chip memory in the microprocessor and where that memory is RAM. EPROM or EEPROM it may be erased therefrom after successful testing of the circuit.

10 Claims, 10 Drawing Sheets

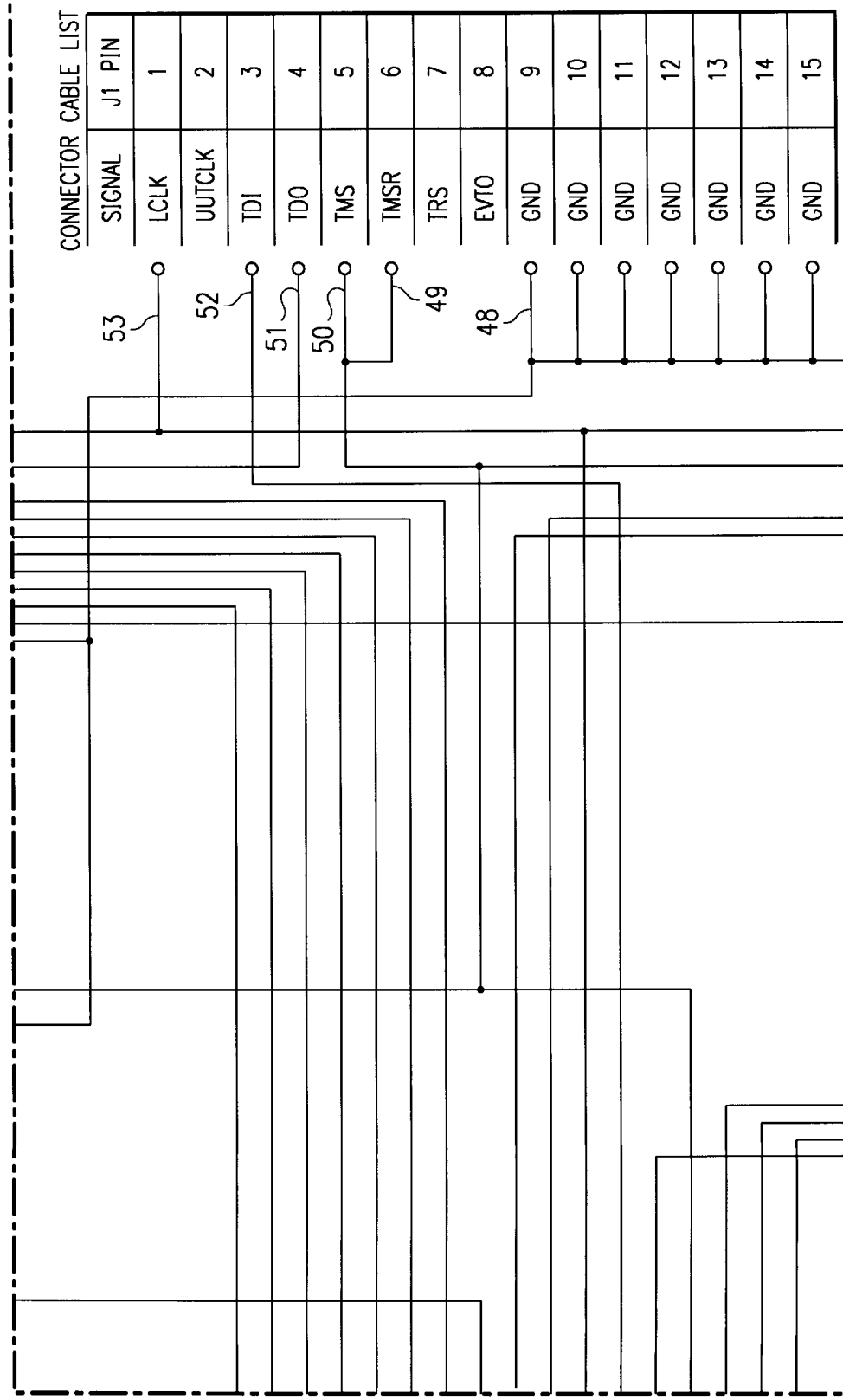

METHOD OF TESTING INTERCONNECTIONS BETWEEN INTEGRATED CIRCUITS IN A CIRCUIT

This application is a Continuation, of application Ser. No. 08/527.991, filed Sep. 13, 1995, now abandoned, which is a Continuation of application Ser. No. 08/106,158, filed Aug. 13, 1993, now abandoned.

BACKGROUND OF THE INVENTION

1. Field of the Invention

The present invention relates to the testing of circuit boards, in particular to the boundary scan testing of a circuit board including a microprocessor.

2. Description of the Prior Art

Manufacturers of electronic circuits commonly produce their circuits in the form of printed circuit boards having mounted on them a plurality of integrated circuits as well as other components. The components are interconnected by conductors or metallic tracks printed on the board with electrical contact between the leads or pins of the components and the tracks made using solder joints. The interconnections may be imperfect and may display short- or open-circuit connections that are erroneous, the errors possibly arising from faults of either the solder joints or the tracks.

Once a circuit board is completed it would, of course, be possible to operate the circuit as a method of testing it but with the complexity of many such boards it would be both difficult and time consuming to test it thoroughly to check that all interconnections were correctly made. Boundary scan testing is a method of testing the interconnections between integrated circuits on a circuit board which enables the test to be carried out more quickly. A system of boundary scan testing is defined by IEEE standard 11491.1-1990 "Standard Test Access Port and Boundary Scan Architecture" also known as JTAG. To support JTAG boundary scan testing an integrated circuit will have specially provided for each of a number of its pins a boundary scan cell, for example, an input latch, an output latch or both of those or a combined input-output latch, for transmitting and receiving signals via the particular pin. In addition a boundary scan cell may include a control latch. The latches may each comprise a shift register latch and a shadow latch. The shift register latches can be joined with others, from the same and other boundary scan cells, to form a long shift register joining up all the input and/or output terminals of the integrated circuits. The cells can therefore be loaded serially with data supplied to an dedicated test data input pin on each integrated circuit. Data already in the shift register latches is shifted out via a dedicated test data output pin of the integrated circuit when the shift register is operated. From time to time data can be transferred between the shift register latches and their corresponding shadow latches.

In a circuit having more than one JTAG integrated circuit the shift registers of each circuit can be joined serially to form one long shift register known as the scan path.

To perform a test of the interconnections between integrated circuits on a circuit board test data appropriately interspersed with control data is fed along the scan path and is loaded into the input and output latches of the integrated circuits. Each boundary scan cell will either be an input cell or an output cell depending on the value loaded in its control latch if it has one; if a cell has no control latch then it will have been built as an input cell or an output cell. Next, each output cell transmits the test data held in its output latch over the interconnections via its pin and each input latch receives test data from the interconnections via its pin and stores it. The resulting pattern of data in the latches can then be shifted out along the scan path for analysis to find out whether the interconnections are functioning correctly. Note that the data held in the shadow latches actually determine whether the boundary scan cells are inputs or outputs and the values to be output on the cells' pins are directly responsive to data supplied to the pins.

Usually the test patterns are generated by a computer which also analyses the resulting patterns. Normally the computer is given a description of the integrated circuits on the scan path, for example which cells have input latches and which have output latches, and a description of the interconnections on the board between the pins. From those descriptions the computer generates a number of test patterns, and after running the test the resulting patterns are analysed to see whether the circuit board has the described interconnections and, if not, to indicate in what way it might be faulty.

Boundary scan testing does provide a quick and reliable method of testing a circuit board; however it does require that the integrated circuits are constructed to include the necessary hardware; this includes not only the latches described above but the means to join them in a shift register and the means responsive to the necessary control signals.

Boundary scan testing is at its simplest and most effective when all the integrated circuits on a circuit board support it. If only some of the integrated circuits support it, then there are a number of things that can be done. The manufacturer of the integrated circuits can redesign the integrated circuits to include the hardware to support boundary scan testing; this takes some time, increases the silicon areas of the devices and hence their cost, and means that the new integrated circuits will not be compatible with the old ones and hence cannot directly replace the old ones since dedicated control pins and test data pins must be provided on the new ones. The manufacturer of the circuit board can add buffers that do support boundary scan testing between the integrated circuits that do not and the rest of the circuit but that increases cost and may affect the performance and timing of the circuit, and will introduce further interconnections that cannot be tested. As a last resort the corrections to the non-supporting integrated circuits can be ignored by the test, so reducing the coverage of the testing; the effects of that can to some extent be reduced by more lengthy and elaborate boundary scan test procedures, such as those described by Robinson and Deshages in a paper entitled "Interconnect Testing of Boards with Partial Boundary Scan" published by Gen Rad, Inc., of 300 Baker Avenue, Concord, Mass. USA.

The disadvantages of these approaches are increased when the non-supporting integrated circuit is a microprocessor, for example a microcontroller, since such devices are usually the centre of functionality of any circuit in which they are included and consequently are connected to many of the other components.

Addition of the necessary JTAG hardware to a microcontroller can involve a considerable amount of work due to the complexity, type and number of input and output pins normally associated with them. Consequently, there is a reluctance to modify existing microcontroller designs to incorporate this feature.

It is an object of the present invention to provide a method of boundary scan testing a circuit, which includes a microprocessor that overcomes at least the difficulties described above.

SUMMARY OF THE INVENTION

According to the present invention there is provided a method of testing interconnections of a circuit having a plurality of integrated circuits at least some of the integrated circuits including storage elements respectively associated with some of the terminals of the integrated circuit and means for joining the storage elements into at least one shift register chain, the method including entering an initial test pattern of bits serially into the storage elements, along the shift register chains, transferring certain of the bits of the initial test pattern from the storage elements into which they were entered, via the terminals and interconnections, to others of the storage elements, retrieving the resulting pattern of bits serially from the storage elements along the shift register chains, and comparing the initial test pattern and resulting pattern to derive information about the interconnections, characterised in that at least one of the plurality of integrated circuits is a microprocessor having internal memory and stored therein a test program which causes the microprocessor to perform a number of operations including entering part of the initial test pattern of bits into the internal memory, reading certain of the bits stored in the internal memory and producing corresponding output signals on terminals signals of the microprocessor connected to particular interconnections, reading bits via the particular interconnections at terminals of the microprocessor and storing the received bits in the internal memory, and producing as an output in serial form the received bits stored in the internal memory, so as to enable interconnections connected to terminals of the microprocessor to be tested.

BRIEF DESCRIPTION OF THE DRAWINGS

The JTAG standard will now be described with reference to FIGS. 1, 2 and 3, followed by a description of a method of boundary scan testing a circuit board including a microprocessor, by way of example only. Reference will be made to the accompanying drawings, of which.

DETAILED DESCRIPTION

Figure 1:
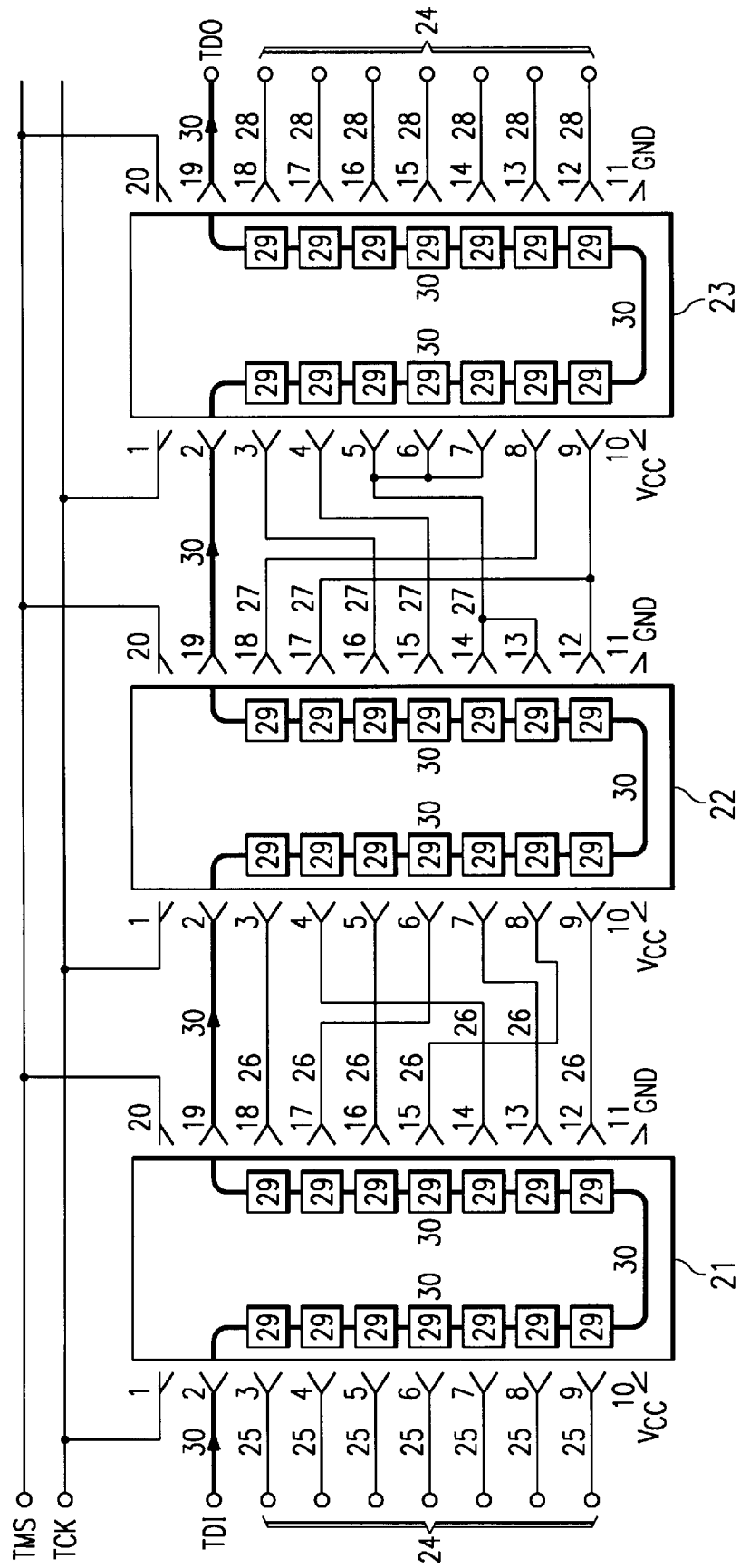
FIG. 1 is a circuit diagram of a circuit having three integrated circuits, all of which support boundary scan testing according to the JTAG standard.

FIG. 1 is a circuit diagram of a circuit having three integrated circuits 21,22, 23 all of which support JTAG boundary scan testing. Each integrated circuit has twenty pins 1–20 of which 1 and 20 are connected respectively to test mode select (TMS) and test clock (TCK) signal lines of JTAG bus, pins 10 and 11 are connected to the power supply, and application pins 3–9 and 12–18 are connected via various of the interconnections 25,26,27,28 to pins of others of the integrated circuits 21,22,23 or to terminals 24. For each of the pins 3–9 and 12–18 there is provided in the integrated circuit a boundary scan cell 29 having a combined input/output latch and a control latch. The boundary scan cells of all the integrated circuits are on a scan path 30 which starts at the terminal TD1, enters integrated circuit 21 at pin 2, passing through the boundary scan cells of that integrated circuit, and then leaves via pin 19 continuing through the integrated circuits 21,22 in a similar way in turn and finishing at terminal TD0. The scan path 30 can operate as a shift register driven by clock signals TCK.

To test, for example, the interconnects 26 between the pins 12–18 of the integrated circuit 21 and the pins 3–9 of the integrated circuit 22, test data and interspersed control data is passed along the scan path 30, under the control of the signals on the TMS and TCK lines, into the input and output latches of the boundary scan cells 29. The input and output latches of the cells for pins 12–18 of the integrated circuit 21 are set up to be outputs and those for pins 3–9 of the integrated circuit 22 set up to be inputs. The important values of the test data are those provided for the pins 12 to 18 of the integrated circuit 21 since it is these that are transferred across to the input latches of the integrated circuit 22, once all the data has been shifted in along the scan path. The data latched across are subsequently shifted out and analysed to check whether the interconnections 26 are all functioning correctly.

As a particular example, a test pattern might be LOW in all of the output latches for pins 12 to 18 except for a HIGH in the latch for pin 15. In the diagram it can be seen that if there were no fault a HIGH would be latched across to the input latch of pin 8 of the integrated circuit 22, the others of pins 3–9 receiving LOWs. If, for example, the interconnect from pin 15 to pin 8 was shorted to that from pin 14 to pin 4, then a HIGH would be received at the latch for pin 4, assuming that the latch for pin 15 was able to drive those interconnections HIGH while the latch for pin 14 was trying to drive them LOW. This extra HIGH in the resulting pattern shifted out along the scan path 30 would be detected by the computer performing the test which would produce an output indicating the nature of the fault detected.

It is clear that fully to test the interconnections for open and short circuits many operations of shifting in data, latching across and shifting out will be required. Test patterns are normally generated by the computer running the test under the control of software, such as the ASSET system of Texas Instruments Incorporated. More complicated interconnects than the one pin to one pin interconnects 26, for example the interconnects 27, can also be tested. Interconnects to terminals 24 could be tested by connecting them to other integrated circuits supporting JTAG off the circuit board under test, but included in the scan path.

Figure 2:
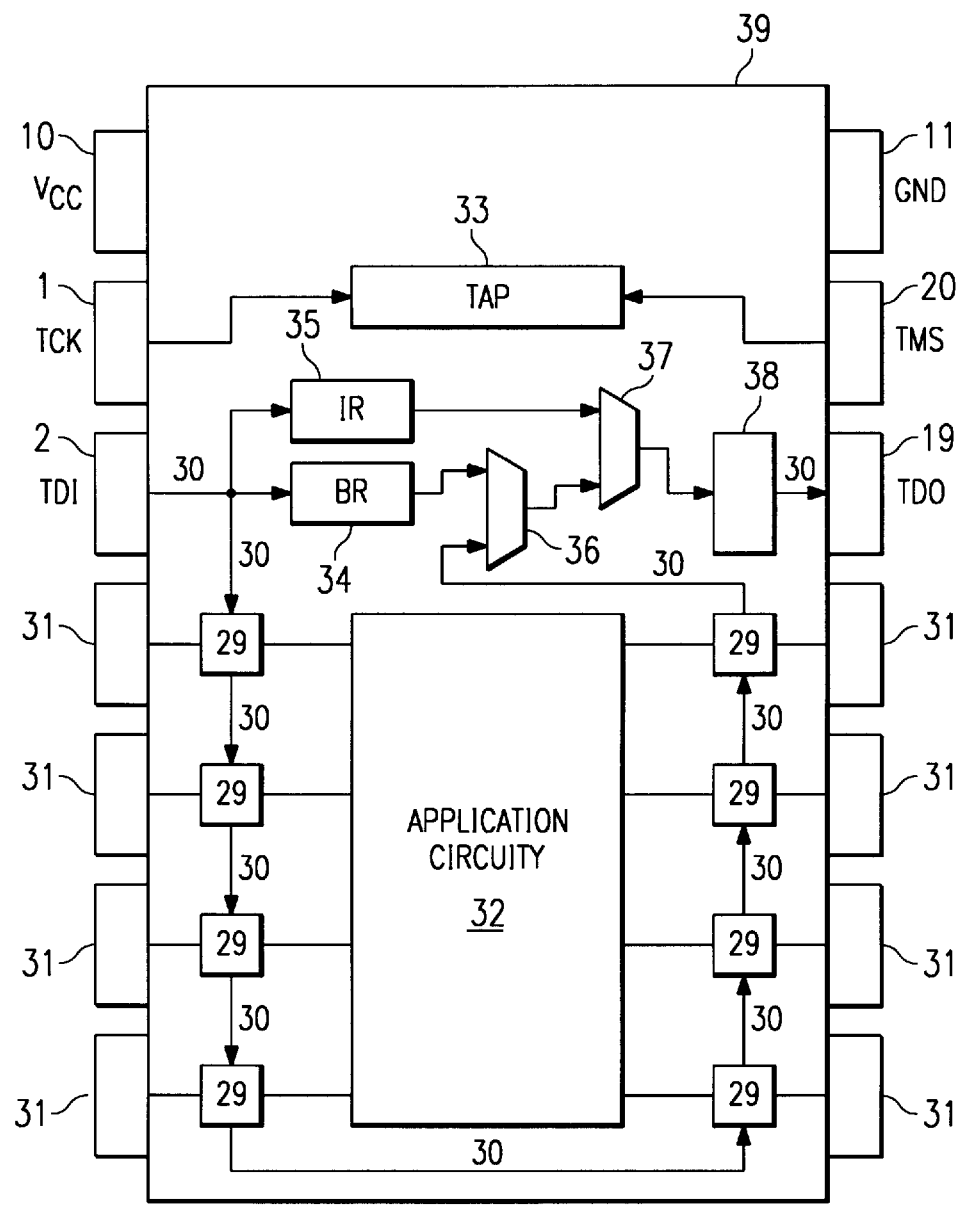
FIG. 2 is a diagram of an integrated circuit that supports boundary scan testing according to the JTAG standard.

FIG. 2 is a diagram of an integrated circuit 39 that supports JTAG similar to those of FIG. 1. In addition to boundary scan cells 29 on the scan path 30, the application pins 31 and pins 2,19 to connect to the scan path 30, pins 1,20 to receive the control signals, TMS, TCK and pins 10,11 to connect to the power supply, FIG. 2 shows application circuitry 32, a test access port (TAP) controller 33, a bypass register 34, an instruction register 35, multiplexers 36,37 and a tristate latch 38. In the JTAG standard the bypass register and the set of boundary scan cells are known as data registers. In a full implementation of the standard there are other data registers provided but their operation is not relevant to the present invention and they will not be described.

The application circuitry provides the normal functions of the integrated circuit when it is not in test mode. During those times it communicates freely with other components via the application pins 31 unhindered by the latches of the boundary scan cells. Note that in practice it may be required that the inputs and outputs of the application circuitry are latched and in that case the latches of the boundary scan cells could be used for that purpose.

The bypass register 34 and the instruction register are alternative scan paths to the boundary scan cells through the integrated circuit 39. Multiplexers 36 and 37 recombine those paths into a single one and latch 38 simply increases the length of each path by one step. The test access port controller is responsive to the TCK and TMS signals of the test bus and also to the value stored in the instruction register; it controls the operation of the rest of the test logic.

The bypass register 34 and the instruction register 35 like the boundary scan cells not only have latches which form a shift register when data is scanned through them but also latches shadowing those latches to and from which values can be transferred from time to time.

Figure 3:
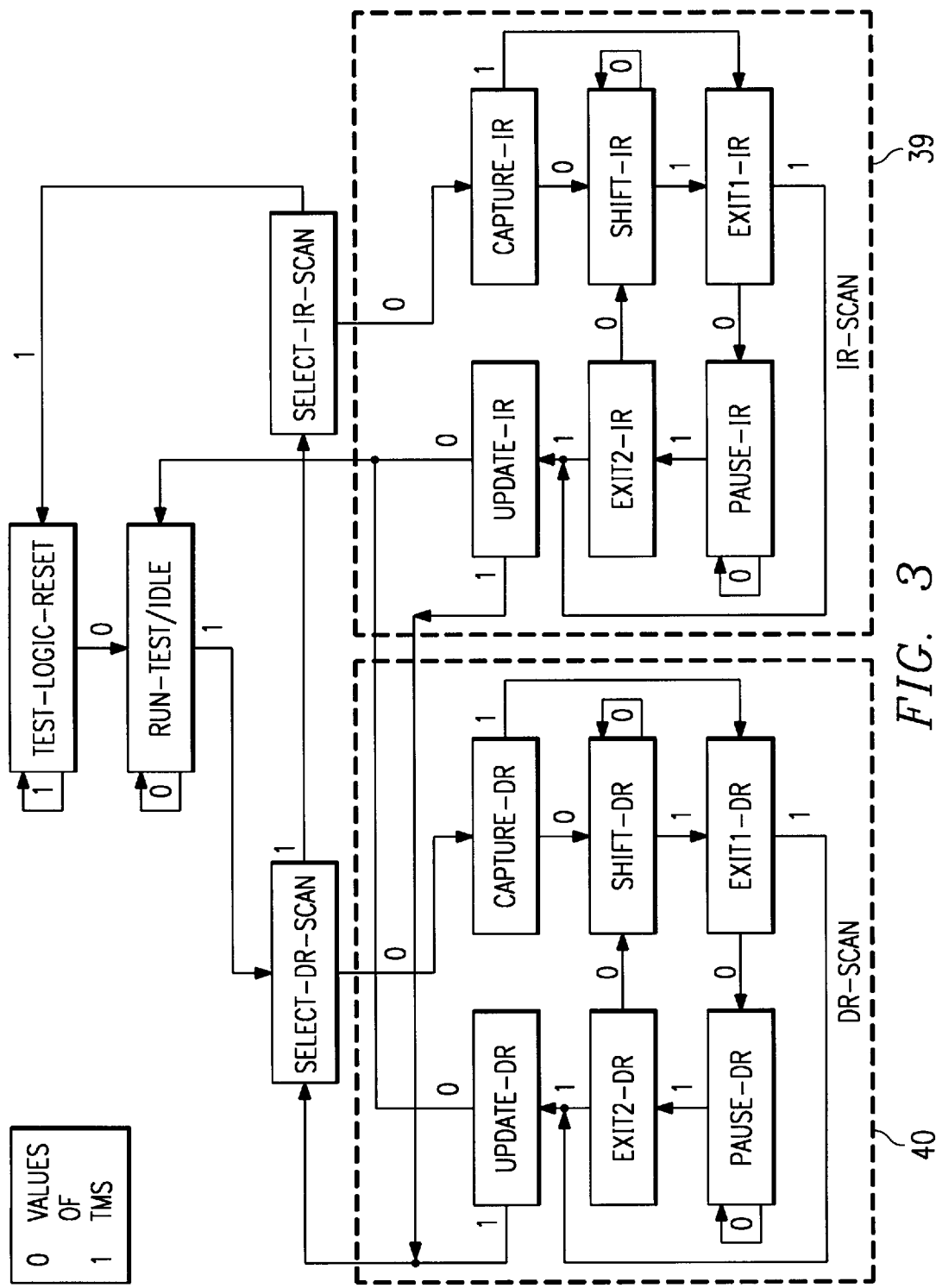
FIG. 3 is a state diagram for the test access port controller of FIG. 2.

FIG. 3 shows a state diagram for the test access port controller 33 of FIG. 2, which conforms to the JTAG standard. The test access port controller examines the TMS signal at each positive going edge of TCK and changes to a new state depending on the value of TMS. This is shown in the diagram by arrows labelled 1 and 0 indicating the values of the TMS signal. The two parts of the diagram enclosed in dotted rectangles are for manipulating respectively a data register and the instruction register and are marked DR-SCAN 40 and IR-SCAN 39. The particular data register manipulated depends on the value held in the instruction register. It should be noted, then, that the selection of the scan path change through the integrated circuit 39 involves both the control signals, TMS and TCK, and the value in the instruction register 35. Moving around the state diagram allows boundary scan tests such as those described above to be carried out.

A full description of the functions of these states can be found in the JTAG standard. Some functions are not implemented in the device described below and only a brief description of the relevant states will be given.

The TEST-LOGIC-RESET state is the state on power up. In this state the test logic is inactive and the integrated circuit 39 performs its normal function using the application circuitry 32.

The RUN-TEST/IDLE state is used in the full standard for some special test functions; those are not implemented in the device described below but the state is provided to allow the states to change in the standard way in response to the TMS and TCK signals.

The SELECT-DR-SCAN and SELECT-IR SCAN states perform no function other than allowing other states to be reached from them.

In the CAPTURE-IR state the instruction register is loaded with a 10000001 pattern and is sent along the scan path. If the TEST-LOGIC-RESET state has been passed through since the last scan operation, the latch 38 which drives the TDO (test data output) pin 19 is enabled to output a LOW or zero, otherwise it is enabled to output the same as that which it was outputting the last time it was enabled.

In the SHIFT-IR state data is advanced through the instruction register, one step per cycle of TCK, from the TDI (test data input) pin 2 to the TDO pin 19. The 10000001 pattern in the register in the CAPTURE-IR state is shifted out and can be used to confirm that the instruction register is connected in the scan path.

EXIT1-IR and EXIT2-IR perform no operation; they allow the shifting operation to be ended.

PAUSE-IR performs no operation; the test access port controller 33 can be held in this state to allow the shifting operation to be suspended for a period of time.

In the state UPDATE-IR the value in the shift register latches of the instruction register are transferred to the shadow latches.

The functions of the states for manipulating the data registers depend on the particular register to be manipulated. They are as follows:

CAPTURE-DR; the data register selected by the value in the instruction register is placed or the scan path, and the latch 38 that drives the TD0 pin 19 is enabled in a similar manner as it is by the CAPTURE-IR instruction, except that when the bypass register is selected the latch 38 is enabled to output a low or zero level. In the case of the boundary scan cells it is during this state that the values present on the input pins and received by the shadow input latches from other boundary scan cells via the interconnects 26,27 are latched, along with data held in the other shadow latches, into the shift register latches.

In the SHIFT-DR state data held in the shift register latches of the selected register is shifted through the integrated circuit 39 from the TD1 pin 2 to the TD0 pin 19 one bit per cycle of TCK. In the case of the data register the data shifted will include control data as well as test data. In the case of the bypass register bits of the data are shifted through the integrated circuit rapidly since the register is only one bit long. This register is used, for example, when it is desired to use the boundary scan cells of other integrated circuits but not those of the particular integrated circuit.

The EXIT-DR, EXIT2-DR and PAUSE-DR states have similar functions to the corresponding IR states.

In the UPDATE-DR state the latches shadowing the shift register latches are updated from those latches. In the case of the boundary scan cells the control data latches and the output latches are given their new values.

Thus to perform the test of interconnects such as the interconnect 26,27 described above it is necessary to pass through the IR-SCAN state 39 once to shift into the instruction register an instruction which puts the boundary scan cells 29 on the scan path, and to pass through the DR-SCAN state 40 twice, once to shift into the boundary scan cells the test data and the control data and to transfer those values into the shadow latches and once more to latch across test data from other boundary scan cells to the input shadow latches, then into the shift register latches and to shift the resulting pattern out of the boundary scan shift register.

The present invention relates to enabling a boundary scan test to be performed so as to include a microprocessor, for example a microcontroller, on the scan path when the microprocessor or microcontroller does not have special circuitry to support boundary scan testing. The approach of the present invention to this problem is to program the microprocessor so that it simulates the behaviour of a JTAG integrated circuit such as those of FIGS. 1 and 2 in response to test bus and test data signals making use of the resources of the microprocessor as they are without providing any additional circuitry.

In the present invention the simulation is carried out under the control of software and the application of the invention to microcontrollers is particularly simple because many microcontrollers have, on chip, an amount of ROM or EPROM or EEPROM in which the software can be stored. Also many microcontrollers have, on chip, an amount of RAM in which the data manipulated by the software can be stored. The resulting device is therefore self-contained.

If the memory in which the test software is stored is of a kind as to permit it, for example if it is RAM or EPROM or EEPROM, the test software could be erased after a JTAG test has been successfully completed so as to release the memory space occupied by the test software for other uses.

By writing software which causes a microprocessor to simulate the hardware and protocol of the JTAG standard, a device, conforming to the standard, can be incorporated into a boundary scan test without any modifications to the device itself. In this way, no costly reengineering of an existing microprocessor is required and microprocessor-based systems can easily be made compatible with existing JTAG test and support hardware.

To simulate the behaviour of a JTAG circuit the software will have to manipulate the input and output to and from the microprocessor chip via its pins. Microcontrollers usually provide flexible methods of controlling the input and output including having pins which are individually programmable which simplifies the task of writing the software.

Figure 4:
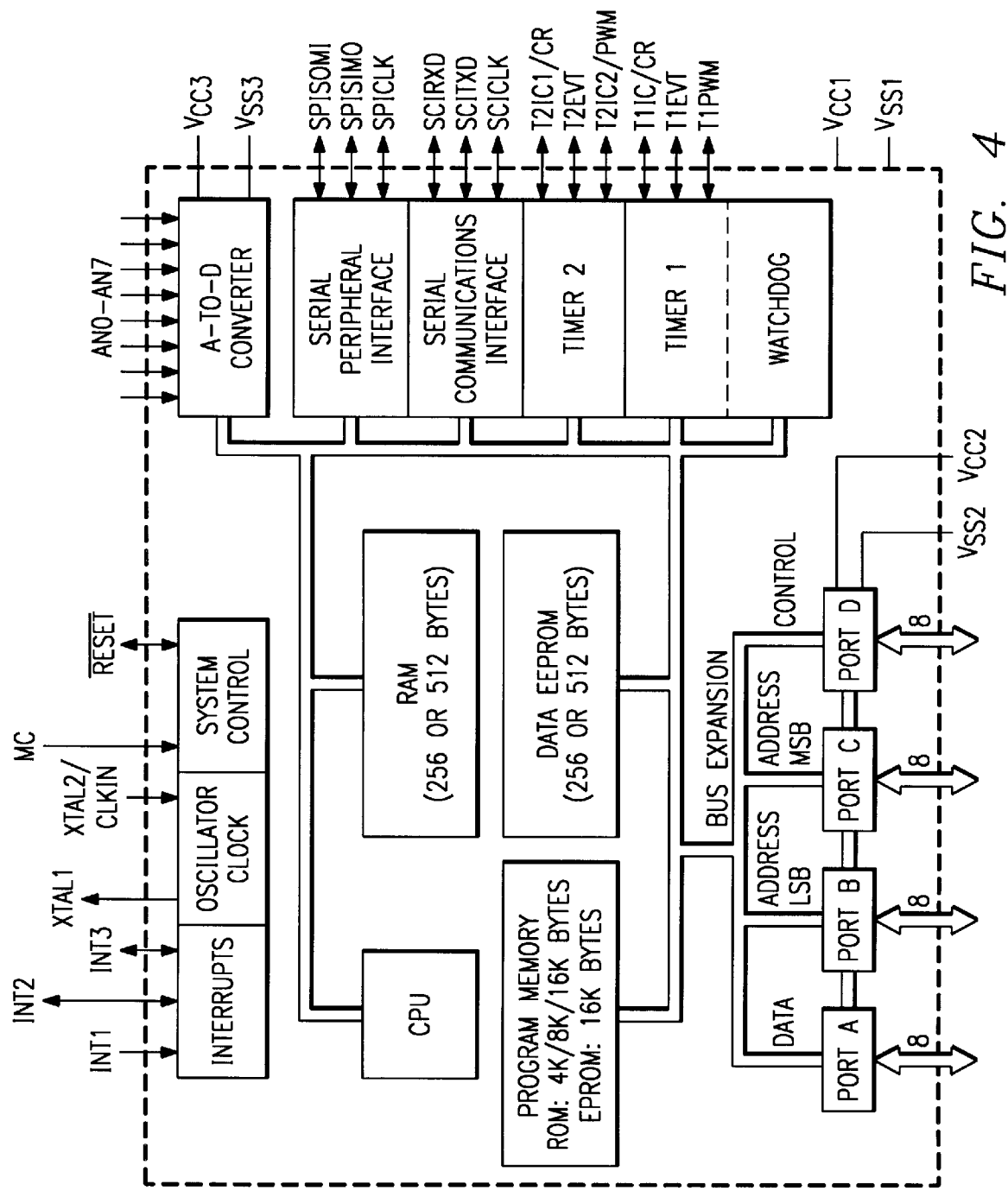
FIG. 4 is a block diagram of one example of a microcontroller.
Figure 5A:
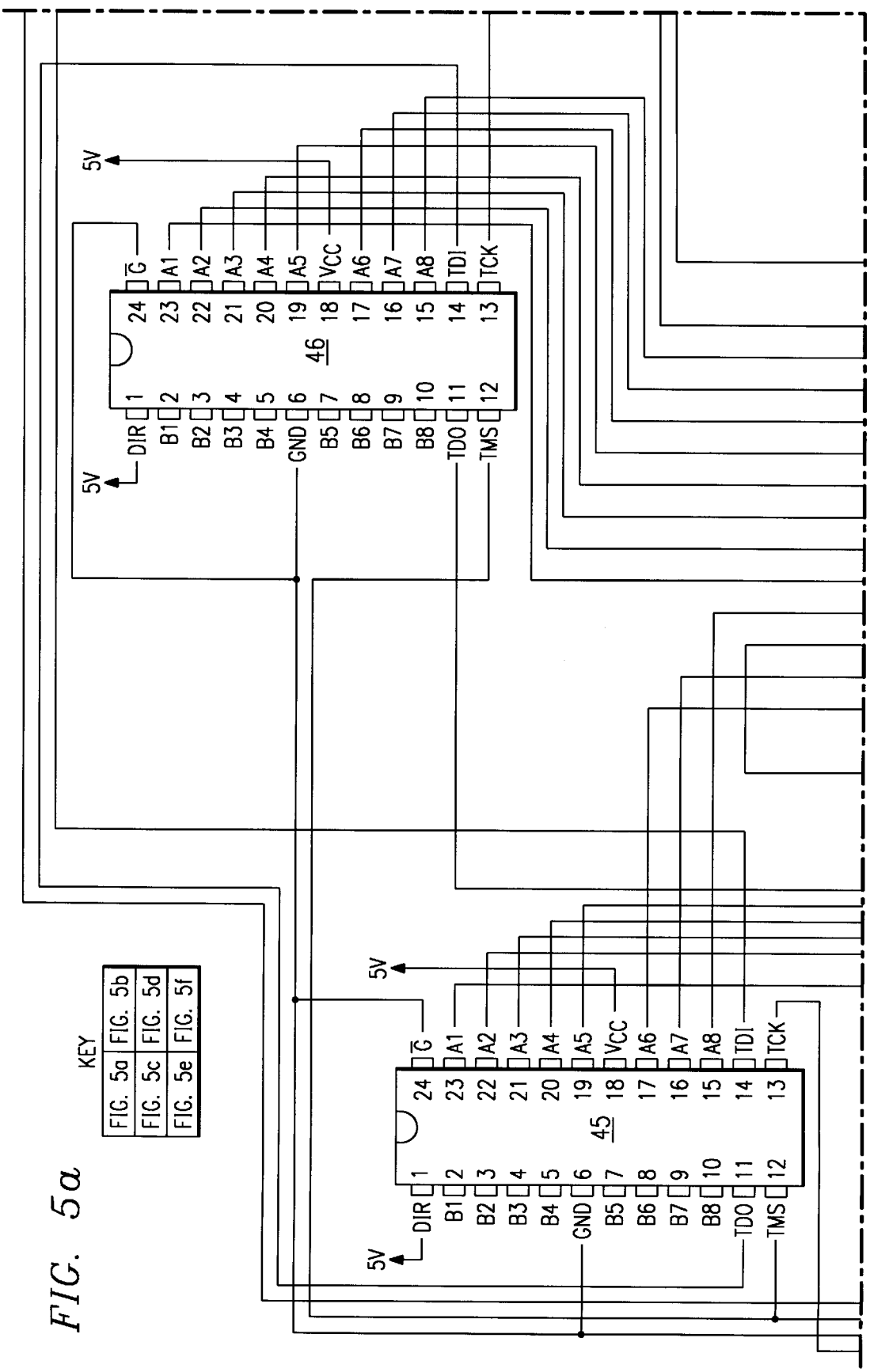
FIG. 5 is a diagram of a circuit including the microcontroller of FIG. 4 that can be arranged to provide for boundary scan testing.
Figure 5B:
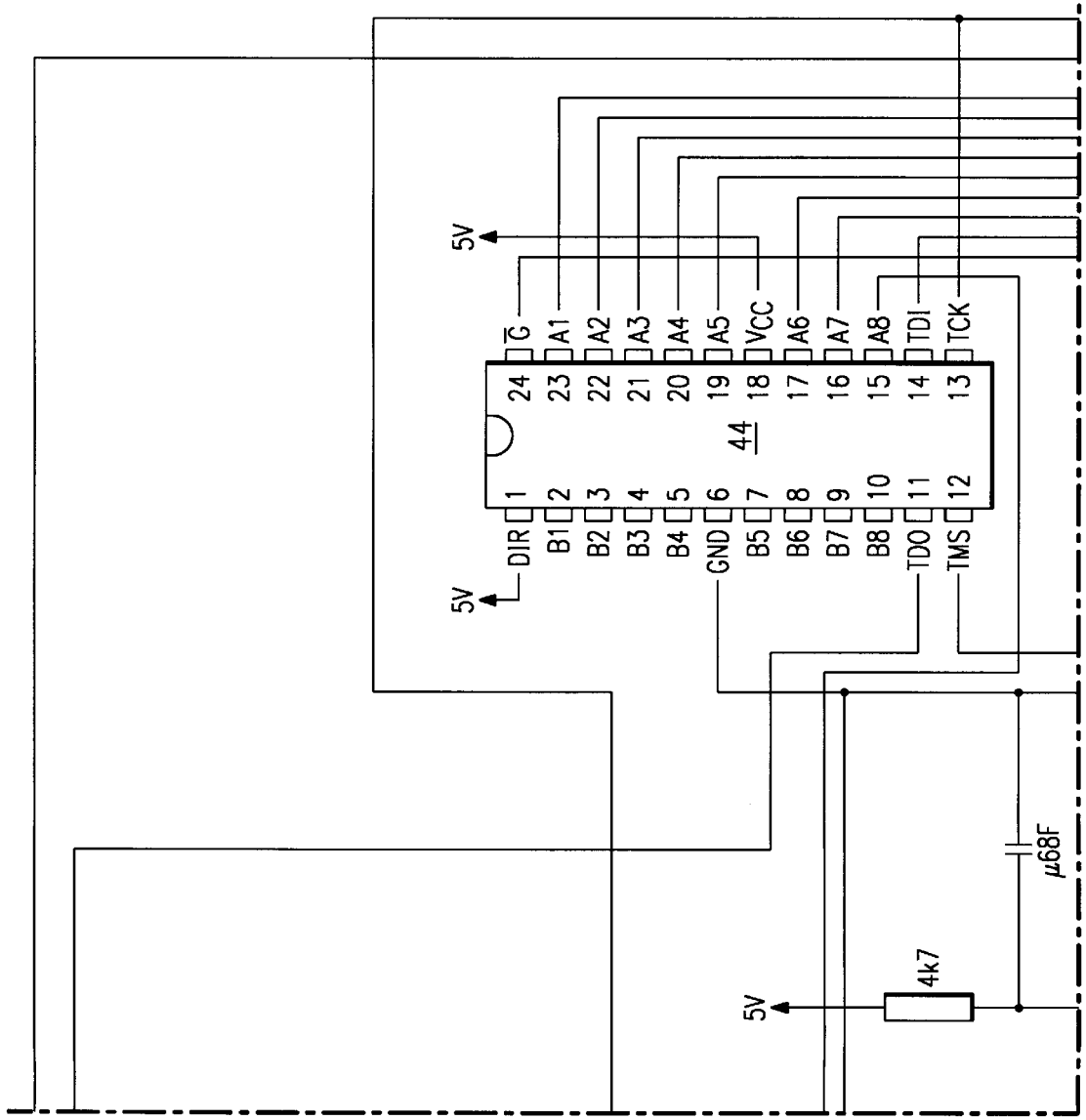
Figure 5C:
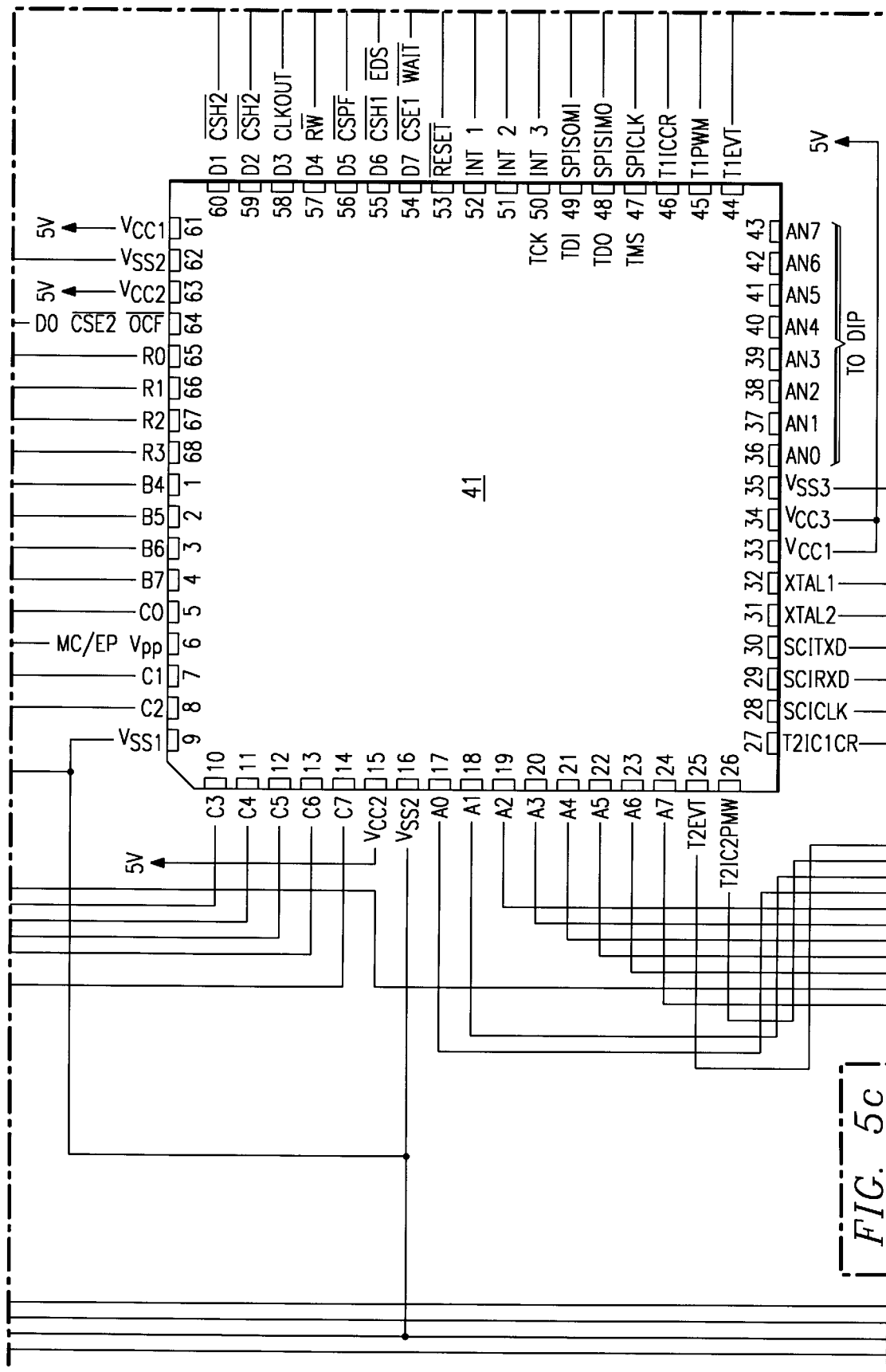
Figure 5E:
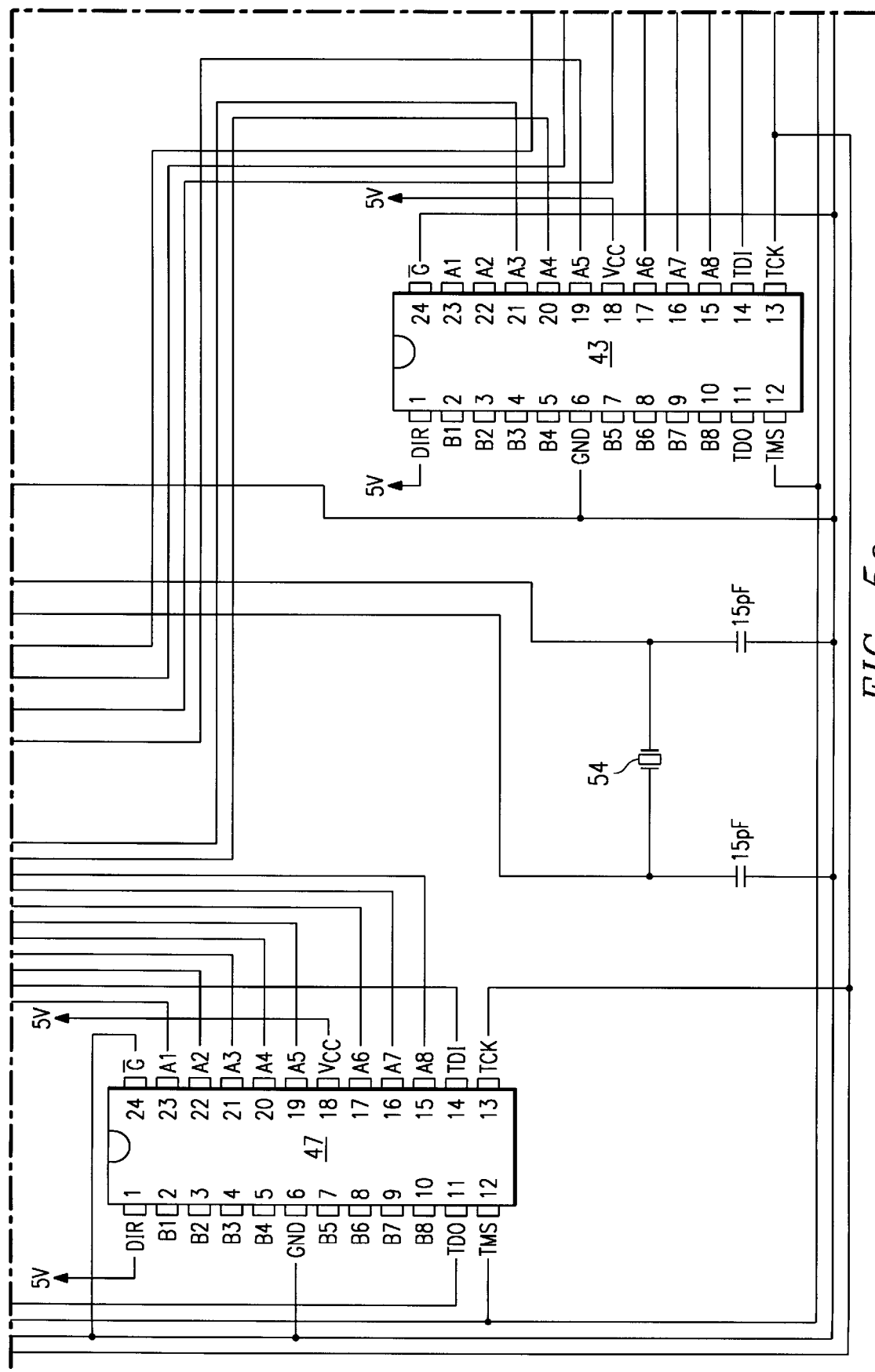
Figure 5F:
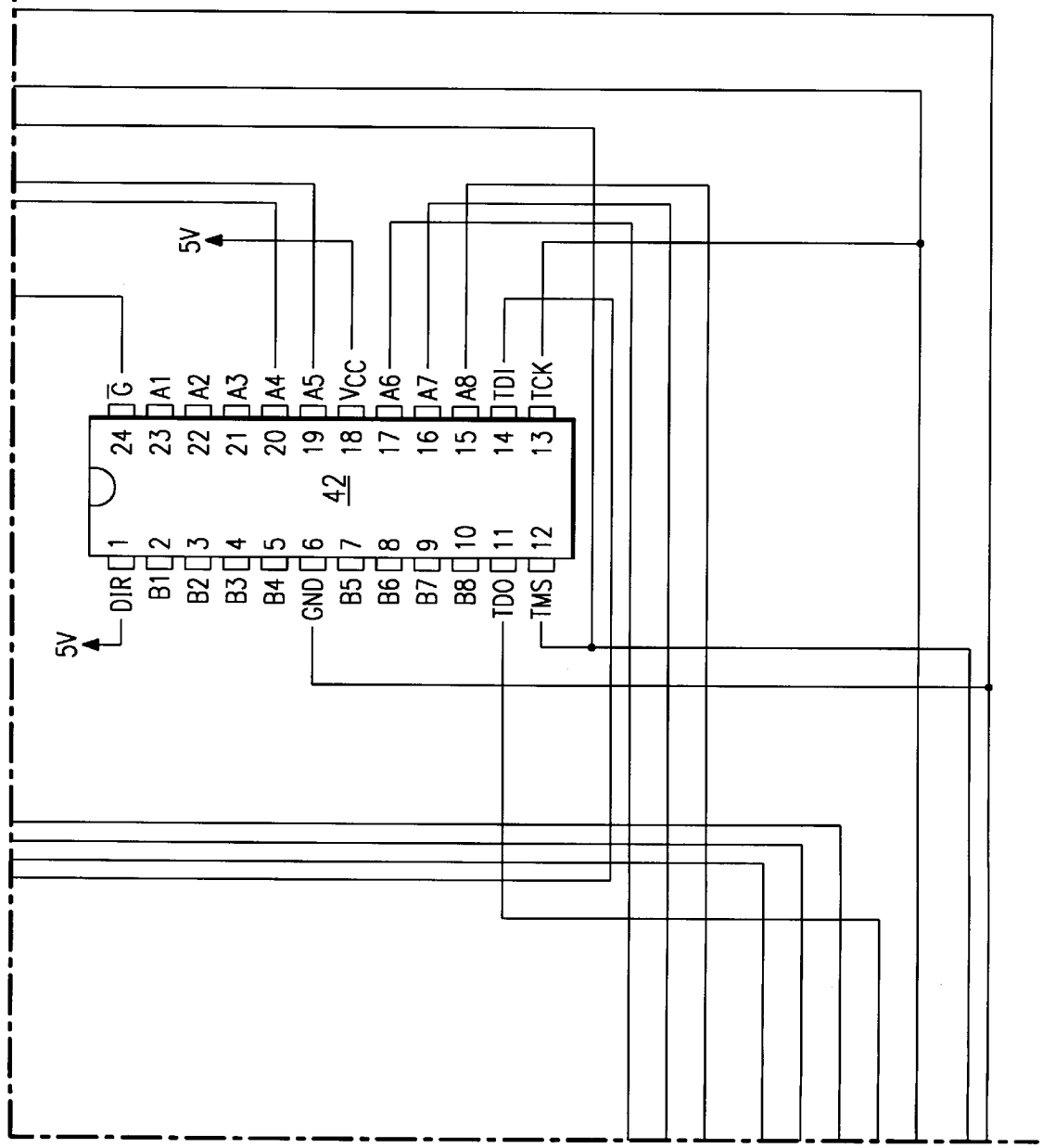

One example of a microcontroller, according to the present invention will now be described. FIG. 4 is a block diagram of a TMS370 CX5X microcontroller manufactured by Texas Instruments. A full description of this device can be found in the data sheet published by Texas Instruments. The program used to enable the micro-controller to support boundary scan testing is appended to this specification. The program is written in TMS 370 assembly language. The program is stored in the program memory which may be either ROM or EPROM. To simulate the JTAG boundary scan test mode the program expects the microcontroller to be operated in its single chip microcomputer mode which is achieved by applying a LOW signal level input to its MC pin. In this mode the microcontroller defaults to its unexpanded mode with its ports A,B,C,D configured as general purpose input/output ports rather than address, data and control bus connections. The program leaves the microcontroller in this mode.

The program expects the TCK, TMS, TD1 signals of the JTAG test bus to be respectively applied to the INT3, SPICLK and SPISOMI pins of the microcontroller and produces the TD0 output signal on the SPISIMO pin; of these pins, INT3, is configured to function as a maskable interrupt input and the other pins which are those of the serial peripheral interface are configured as general purpose input/output pins of the remaining pins of the microcontroller INT1 and INT2, those of the serial communications interface and those of the timers are configured as general purpose input/output pins and the analogue port is configured as a general purpose digital input port.

The program simulates the functions of the usual JTAG circuitry and in particular it simulates the functions of the test access port controller 33 and its progress through the JTAG state diagram (FIG. 3). To do this the program maintains two registers in the RAM memory of the microcontroller, which indicate the next state, one for HIGH values of TMS and one for LOW. Since the JTAG test access port controller and hence the program start off in the TEST-LOGIC-RESET state the program initialises those two registers to indicate TEST-LOGIC-RESET and RUN-TEST/IDLE respectively as the next states. The program then sets up INT3 to generate interrupts at the positive going edges of TCK. On interrupt, an interrupt handling routine checks the value of the TMS signal to see if it is LOW or HIGH and then calls one of a number of routines which perform the functions of the next state, the particular routine chosen being that indicated by the appropriate next state register. In addition to the functions of their state those routines update the next state register appropriately, so that on subsequent interrupts the states are traversed in the manner shown in FIG. 3.

Some of the states require action on the negative going edges of TCK, such action being in particular the outputting of the TDO signal ready for it to be received by another integrated circuit on the next positive going edge. The state routines handle this by resetting INT3 to generate interrupts on negative going edges and waiting for an interrupt. When an interrupt occurs the interrupt handling routine outputs the next bit of the TD0 signal and restores INT3 to generating interrupts on positive going edges.

The program maintains a register in the RAM of the microcontroller for simulating the instruction register. This register is manipulated by the state routines for the states of the IR-SCAN box 39 of FIG. 3 in a similar manner to that applied to the instruction register 35 of the JTAG circuitry. The value or instruction code in this register is then available to the state routines for the states of the DR-SCAN box 40 of FIG. 3 so that they can modify their actions accordingly.

JTAG circuitry may in general support all or only some of the instructions specified in the standard. The program appended to this specification supports only the EXTEST and BYPASS instructions. If codes for other instructions are found in the instructions register then the BYPASS instruction is performed.

When the code for the EXTEST instruction is in the instruction register maintained by the program the DR-SCAN 40 state routine manipulates a data register.

The program occupies seventeen consecutive eight-bit registers of the RAM memory of the microcontroller. A table given in the comment lines at the beginning of the appended program shows how the data register is organised. This data register corresponds to the shift register latches of the boundary scan cells 29 of integrated circuits with special JTAG circuitry provided. The register that corresponds to the shadow latches consists of the latches of the ports of the microcontroller that already exist. Those latches exist in the portion of the memory map of the microcontroller known as the peripheral file. In order that transfers between the data register and the port latches, which transfers correspond to transfers between the shadow latches and their shift register latches respectively, can be made simply, the organisation of the data register reflects that of the port latches in the memory map. Such an organisation has no disadvantages for test pattern generation and analyses systems, such as the ASSET system mentioned above, since they require no particular ordering of input/output latches control data latches and the like, but they do require that the order of these latches and the boundary scan cell or pin to which they belong, are specified to them. Therefore, to test a TMS370 CX5X microcontroller having the appended program using a system such as ASSET, that information as contained in the table will have to be specified to the system.

The transfers made between the data register and the existing port latches are made by the DR-CAPTURE and DR-UPDATE state routines. Respectively, these routines transfer data from the existing port latches to the data register and in the reverse direction. The shifting of the data register is carried out by the SHIFT-DR routine in which the bit present at the TD1 pin 2 is shifted into bit 135 of the data register (see the table at the start of the appended program), data bits already in the register are moved down one bit and bit 0 is set up to be output at the TD0 pin 19 at the next negative going edge of the TCK signal by placing it in a register in the RAM called OUTREG in the program. The bit held in OUTREG is set up by the program on the TD0 pin on a negative going edge of TCK; in this way the function of the latch 38 of JTAG integrated circuits is simulated.

From the table it can be seen that pins of the microcontroller included on the scan path variously have combined input/output latches, separate input and/or output latches and possibly a control latch. For each of those latches there is a bit of the data register. However, there are some bits of the data register marked by a dash in the "definition" column of the table that are not intended to have corresponding shadow latches. These bits lengthen the shift register and so should be specified to the pattern generation and analysis system as being present but containing no information when read by the analysis system. These bits when the other bits of the data register are transferred into their shadow latches will also, of course, be written into the peripheral file into whatever latch, if any, happens to be at that location. In the present example this has no undesired effects. However in other examples perhaps running other microprocessors this may not be so. A remedy would be to mask out these bits with appropriate values as they are written to the peripheral file or its equivalents.

When the code for the BYPASS instruction is in the instruction register the DR-SCAN 40 state routines simulate the operation of a JTAG integrated circuit having its bypass register on the scan path. In fact all instruction codes other than that for EXTEST will be treated as a BYPASS instruction. The simulation is achieved in the following way:

In the CAPTURE-DR state routine, a Low or zero is placed in OUTREG ready to be set up on the TD0 pin on the next negative going edge of TCK. In the SHIFT-DR state routine the value present at the TDI pin is read and is placed in OUTREG ready to be set up on the TD0 pin. In the UPDATE-DE state routine no operation other than to update the next state registers is performed.

The DR-SCAN 40 state routine also makes allowance, for both the BYPASS and EXTEST instructions, for the pipelining of the TMS signal.

It will be appreciated that the method of simulating the behaviour of a JTAG integrated circuit employed by the program described above is not the only possibility. For example, instead of being interrupt driven the program could poll the TCK signal, the data register could be organised differently or a different selection of the pins to which the test bus (TCK,TMS,TDI,TD0) is connected could be made. As another example, a similar program might be written for a microprocessor whose equivalents of ports A,B,C,D of the TMS 370 CX5X can only be configured as ports for data, address and control busses. In such a program it would not be so straightforward to produce the desired outputs on those pins, since for example the instruction set of the microprocessor might not allow the pins for the address and data busses to be programmed separately. However, there will be an instruction which writes a data value to a certain address and using this instruction with the desired values could be used to program the ports together. Since these values would possibly only remain on the pins for a few cycles of the microprocessor's clock, allowances would have to be made so that the period during which the data was set up on the pins included the time at which it was latched by other JTAG integrated circuits. Programming the control port at the same time as the address and data busses might not be possible, and the interconnects connected to those pins would have to be tested at different times, with allowance made for that in the test pattern generation and analysis system.

It is not necessary that the software be stored in memory internal to the microprocessor. The JTAG simulation software can be stored in many places, depending on the configuration of the system. If external ROM or PROM or EPROM is used for example, the software could reside there and be a minimal overhead to the total system memory. Conveniently the software could be transferred as a block from the external ROM or PROM or EPROM to the internal RAM of the microprocessor and run from there. Alternatively, a removable test ROM or PROM or EPROM could be used, and replaced by application software after successful testing of the printed circuit board. Many microcontrollers are intended for embedded control in massproduced end applications. Such devices frequently use on chip masked ROM or EPROM. In the case of EPROM, the device could be erased and reprogrammed by the application software following a successful test.

A particularly advantageous solution can be achieved with microcontrollers such as the TMS370 family, which have on chip EEPROM (non-volatile memory). The JTAG software can be embedded in the device EEPROM before shipment to the manufacturer of the end equipment, and the application software provided by him on ROM or PROM or EPROM (either on-or off-chip) can read a check byte in the EEPROM at power-up which forces execution of the JTAG software.

Following a successful test, the JTAG software can be erased by the microcontroller itself, perhaps after receiving a special command word in the simulated instruction register. In this way, the JTAG software leaves no trace of its existence following the test, and the resources it had used are available to the application software in normal use. The special command word could be one of the unused codes of the JTAG standard. The EEPROM of the TMS370 family has the ability to be written to our erased by the microcontroller itself, the 12.6 volts required being generated from the supply rails by an on-chip charge pump.

If the software or the data it manipulates is not stored within the microprocessor but rather off-chip in some other memory then certain of the input and output pins of the microprocessor will be required for transferring instruction words or data words between the microprocessor and that memory. The lines requires for the TMS370 CX5X microcontroller of FIG. 4, would include ports A to D. These lines would not, therefore, be available for direct JTAG testing. However some indication of their functioning would still be provided by a JTAG test since if the program or data was not correctly transferred the test pattern generation and analysis system would not receive a proper response from the microprocessor thus indicating a fault with those lines. Although the simulation described produces a microprocessor that conforms to the JTAG protocol for boundary scan testing systems, the present invention could be applied to other systems, protocols or standards of boundary scan testing.

FIG. 5 is a diagram of a circuit including a TMS 370C756 microcontroller which has stored in its EPROM memory the program appended to this patent specification. FIG. 5 demonstrates the use in boundary scan testing of the circuit and its subsequent use in the application the circuit was designed for.

The circuit has at its centre the TMS 370C756 microcontroller 41. The analogue port pins AN0 . . . AN7 of the microcontroller 41 are connected to a set of eight DIP switches not shown, providing, depending on their positions, either a HIGH or LOW level to the respective pins of the analogue port. Many of the other pins are connected to various of the pins of the A ports of the six octal buffers, 42 to 47 of the type SN74BCT8245. These buffers have special circuitry provided to support JTAG boundary scan testing.

The circuit has terminals 48 to 53 for a JTAG connector cable which connects the circuit to a test pattern generation and analysis system. In particular there are four terminals 50–53 for connection of the test bus signals TMS,TD0,TDI, TCK. The TMS terminal 50 is connected to the TMS input pin of each of the octal buffers 42–27 and to the SPICLK pin of the microcontroller 41 which serves as its TMS pin. The TCK terminal 53 is connected to the TCK input pin of each of the octal buffers 42–47 and to the INT3 pin of the microcontroller 41 which serves as its TCK pin. Also provided in the circuit is a scan path; this starts at the TD1 terminal 52 and passes into the microcontroller 41 at its SPISOMI pin, which serves as its TCK pin. The scan path then continues on through each of the octal buffers 42–47 in turn, passing into each at its TDI pin and passing out at its TD0 pin, to arrive finally at the TD0 terminal 52.

The octal buffers 42–47 and the microcontroller 41 have suitable connections to a power supply, not shown. The microcontroller is suitably connected to a crystal 54 for controlling the frequency of its internal clock. The reset pin of the microcontroller 41 is connected through an RC network to a HIGH signal level, so that the reset pin is held at its active LOW level for a few moments after the power supply is turned on, before rising to a HIGH level and allowing the microcontroller 41 to start operating. The octal buffers 42–47 have their DIR pins connected to a HIGH level, so that the buffers are configured with their A port pins as inputs and their B port pins as outputs. Various of the B port output pins of the octal buffers 42–47 are connected to driver circuits not shown which, depending on the levels of the signal outputs of the buffer, illuminate light emitting diodes, not shown.

The microcontroller 41 having the appended program stored in its EPROM makes the testing of all the interconnections of the circuit with a JTAG test pattern generator and analysis system a straightforward matter. Firstly, the test pattern generator and analysis system is given a description of the circuit in terms of the interconnections between the integrated circuits, those being those between the octal buffers 42–47 and the microcontroller 41, and in terms of the order of, and the latches contained on, the boundary scan cells of the integrated circuits. For the microcontroller the boundary scan cells are simulated by the appended program and the information required is given in the table at the start of the program. The circuit can then be connected to the test pattern generator and analysis system.

In trials of the microcontroller with the appended program it was found that the test bus clock signal TCK could be operated at a rate of up to about 4 kHz.

The full JTAG standard requires, for an integrated circuit to conform to that standard, that the integrated circuit can be clocked at any speed from OHz to several MHz. Although clearly the maximum clock rate of 4 kHz achieved by the microcontroller in the trial does not conform to the wide ranging speed requirement of the standard, the microcontroller does conform to the JTAG protocol and therefore enables the circuit interconnections to be tested. Since the test as described above does not require redesign of the microcontroller to enable the test to be executed, the microcontroller can retain compatibility with its earlier versions.

The test now proceeds, as described above in relation to FIG. 1, with the test pattern generator generating test patterns which are fed to the integrated circuits of the circuit along the scan path. Certain of the bits of the test pattern after being latched into the integrated circuits are transferred via the circuit interconnections to other latches of the integrated circuits. The resulting pattern of bits is output along the scan path to the analysis system for analysis.

The appended program as it stands does not terminate and expects the testing to continue indefinitely. However it could be modified so that if there were an application program also resident in the EPROM of the microcontroller this could be executed while the appended program was waiting in the TEST-LOGIC-RESET state.

The appended program can be used in the following way. The program is stored in the EPROM of the microcontroller by the manufacturer of the microcontroller before the device is shipped to the manufacturer of a circuit into which it is to be assembled, for example that of FIG. 5, who installs the microcontroller in the circuit and tests the circuit wiring using boundary scan testing as described above. Once the test has been successfully completed, the program is of no further use (except perhaps if the circuit is returned for servicing by its end user), and consequently the storage space in the EPROM is wasted. The manufacturer of the assembled circuit can, if he wishes, erase the program in the EPROM and use the space to store at least part of an application program required to operate the circuit. In that way, all of the EPROM storage space can be used for application programs after the test program has been erased. In the case of the circuit of FIG. 5 such an application program might illuminate the light emitting diodes in a sequence which depends on the setting of the DIP switches .

Such rewriting of the EPROM means that a JTAG testable microcontroller has been provided not only without special circuitry being added to the design of the microcontroller but also without permanently using any of the resources of the microcontroller except for the four pins used for connection to the test bus. The latter is not a serious disadvantage because very few circuits including a microcontroller require the use of all of their pins and the program can easily be rewritten so that connection of the test bus is made to otherwise unused pins. If necessary it might be possible after testing of the circuit to reconnect the pins connected to the test bus to other interconnections by moving links or with other means.

APPENDIX
-23-

```
;
; THE DATA REGISTER DEFINITIONS FOLLOW :-
;
;   BIT NUMBER    PIN No.    DEFINITION    REGISTER    BIT No.    PFILE
;
;       0           17        A0 DATA        R100          0        P022
;       1           18        A1 DATA                      1
;       2           19        A2 DATA                      2
;       3           20        A3 DATA                      3
;       4           21        A4 DATA                      4
;       5           22        A5 DATA                      5
;       6           23        A6 DATA                      6
;       7           24        A7 DATA                      7
;       8           --        A0 DDR         R101          0        P023
;       9           --        A1 DDR                       1
;      10           --        A2 DDR                       2
;      11           --        A3 DDR                       3
;      12           --        A4 DDR                       4
;      13           --        A5 DDR                       5
;      14           --        A6 DDR                       6
;      15           --        A7 DDR                       7
;      16           65        B0 DATA        R102          0        P026
;      17           66        B1 DATA                      1
;      18           67        B2 DATA                      2
;      19           68        B3 DATA                      3
;      20            1        B4 DATA                      4
;      21            2        B5 DATA                      5
;      22            3        B6 DATA                      6
;      23            4        B7 DATA                      7
;      24           --        B0 DDR         R103          0        P027
;      25           --        B1 DDR                       1
;      26           --        B2 DDR                       2
;      27           --        B3 DDR                       3
;      28           --        B4 DDR                       4
;      29           --        B5 DDR                       5
;      30           --        B6 DDR                       6
;      31           --        B7 DDR                       7
;      32            5        C0 DATA        R104          0        P02A
;      33            7        C1 DATA                      1
;      34            8        C2 DATA                      2
;      35           10        C3 DATA                      3
;      36           11        C4 DATA                      4
;      37           12        C5 DATA                      5
;      38           13        C6 DATA                      6
;      39           14        C7 DATA                      7
;      40           --        C0 DDR         R105          0        P02B
;      41           --        C1 DDR                       1
;      42           --        C2 DDR                       2
;      43           --        C3 DDR                       3
;      44           --        C4 DDR                       4
;      45           --        C5 DDR                       5
;      46           --        C6 DDR                       6
;      47           --        C7 DDR                       7
;      48           64        D0 DATA        R106          0        P02E
;      49           60        D1 DATA                      1
;      50           59        D2 DATA                      2
;      51           58        D3 DATA                      3
;      52           57        D4 DATA                      4
;      53           56        D5 DATA                      5
;      54           55        D6 DATA                      6
;      55           54        D7 DATA                      7
;      56           --        D0 DDR         R107          0        P02F
;      57           --        D1 DDR                       1
;      58           --        D2 DDR                       2
```

-24-

```
;    59    --    D3 DDR              3
;    60    --    D4 DDR              4
;    61    --    D5 DDR              5
;    62    --    D6 DDR              6
;    63    --    D7 DDR              7
;    64    --    T1EVT DDR    R108   0    P04D
;    65    --    --                  1
;    66    44    T1EVT DATA OUT      2
;    67    44    T1EVT DATA IN       3
;    68    --    --                  4
;    69    --    --                  5
;    70    --    --                  6
;    71    --    --                  7
;    72    --    T1CR DDR     R109   0    P04E
;    73    --    --                  1
;    74    46    T1CR DATA OUT       2
;    75    46    T1CR DATA IN        3
;    76    --    T1PWM DDR           4
;    77    --    --                  5
;    78    45    T1PWM DATA OUT      6
;    79    45    T1PWM DATA IN       7
;    80    --    T2EVT DDR    R110   0    P06D
;    81    --    --                  1
;    82    25    T2EVT DATA OUT      2
;    83    25    T2EVT DATA IN       3
;    84    --    --                  4
;    85    --    --                  5
;    86    --    --                  6
;    87    --    --                  7
;    88    --    T2CR DDR     R111   0    P06E
;    89    --    --                  1
;    90    27    T2CR DATA OUT       2
;    91    27    T2CR DATA IN        3
;    92    --    T2PWM DDR           4
;    93    --    --                  5
;    94    26    T2PWM DATA OUT      6
;    95    26    T2PWM DATA IN       7
;    96    --    SCICLK DDR   R112   0    P05D
;    97    --    --                  1
;    98    28    SCICLK DATA OUT     2
;    99    28    SCICLK DATA IN      3
;   100    --    --                  4
;   101    --    --                  5
;   102    --    --                  6
;   103    --    --                  7
;   104    --    SCIRXD DDR   R113   0    P05E
;   105    --    --                  1
;   106    29    SCIRXD DATA OUT     2
;   107    29    SCIRXD DATA IN      3
;   108    --    SCITXD DDR          4
;   109    --    --                  5
;   110    30    SCITXD DATA OUT     6
;   111    30    SCITXD DATA IN      7
;   112    36    AN 0         R114   0    P07D
;   113    37    AN 1                1
;   114    38    AN 2                2
;   115    39    AN 3                3
;   116    40    AN 4                4
;   117    41    AN 5                5
;   118    42    AN 6                6
;   119    43    AN 7                7
;   120    --    --           R115   0    P017
;   121    --    --                  1
;   122    --    --                  2
```

```
                            -25-
;     123        --       --                      3
;     124        --       --                      4
;     125        --       --                      5
;     126        52       INT1 DATA IN            6
;     127        --       --                      7
;     128        --       --            R116      0      P018
;     129        --       --                      1
;     130        --       --                      2
;     131        51       INT2 DATA OUT           3
;     132        --       INT2 DDR                4
;     133        --       --                      5
;     134        51       INT2 DATA IN            6
;     135        --       --                      7
;
;     TDI = SPISOMI    PIN 49
;
;     TDO = SPISIMO    PIN 48
;
;     TMS = SPICLK     PIN 47
;
;     TCK = INT3       PIN 50
;
;     INTERNAL REGISTER ALLOCATION FOLLOWS :-
;
;       STACK            R20   (14H)
;
;       OUTREG           R50   (32H)    DATA REGISTER OUTPUT LATCH
;
;       BYPASS REGISTER  R51   (33H)    not used
;
;       STATE_L REG      R52   (34H)    HOLDS MSB OF NEXT STATE IF TMS=0
;
;       STATE_L REG      R53   (35H)    HOLDS LSB OF NEXT STATE IF TMS=0
;
;       STATE_H REG      R54   (36H)    HOLDS MSB OF NEXT STATE IF TMS=1
;
;       STATE_H REG      R55   (37H)    HOLDS LSB OF NEXT STATE IF TMS=1
;
;       INSTRUCTION REG  R56   (38H)
;
;       TMS_DELAY        R57   (39H)    DELAY FLAG FOR TMS PIPELINE
;
;       DATA REGISTER    R100 TO R116  (64H)  (74)
;
```

-26-

```
            .text
            .GLOBAL  DR_CAPTURE
            .GLOBAL  DR_SHIFT
            .GLOBAL  DR_EXIT1
            .GLOBREG STATE_H
            .GLOBREG STATE_L
            .GLOBREG INSTRUCT_REG
            .GLOBREG OUTREG
            .GLOBREG TMS_DELAY
;
DR_CAPTURE      MOV     #01H,TMS_DELAY      ;
;
                CMP     #00H,INSTRUCT_REG   ; CHECK INSTRUCTION REGISTER
                JNZ     BYPASS_C            ; IF NOT 00, ASSUME BYPASS
;
;
; INSTRUCTION=0, SO MODE MUST BE XTEST
; LOAD ALL I/O INTO RAM BASED SHIFT REGISTER
;
                MOV     P022,R100           ; PORT A I/O
                MOV     P023,R101           ; PORT A DDR
                MOV     P026,R102           ; PORT B I/O
                MOV     P027,R103           ; PORT B DDR
                MOV     P02A,R104           ; PORT C I/O
                MOV     P02B,R105           ; PORT C DDR
                MOV     P02E,R106           ; PORT D I/O
                MOV     P02F,R107           ; PORT D DDR
                MOV     P04D,R108           ; TIMER 1 I/O
                MOV     P04E,R109           ; TIMER 1 I/O
                MOV     P06D,R110           ; TIMER 2 I/O
                MOV     P06E,R111           ; TIMER 2 I/O
                MOV     P05D,R112           ; SCI I/O
                MOV     P05E,R113           ; SCI I/O
                MOV     P07D,R114           ; A-D I/P
                MOV     P017,R115           ; INT1 I/O
                MOV     P018,R116           ; INT2 I/O
;
;
CAPTURE_NEXT    MOVW    #DR_SHIFT,STATE_L   ; NEXT STATE IS DR_SHIFT
                MOVW    #DR_EXIT1,STATE_H   ; NEXT STATE IS DR_EXIT1
                RTS
;
BYPASS_C        MOV     #010H,OUTREG        ; LOAD '0' INTO OUTPUT REGIST
                JMP     CAPTURE_NEXT
;
                .END
```

```
            .text
            .GLOBAL   DR_EXIT1
            .GLOBAL   DR_PAUSE
            .GLOBAL   DR_UPDATE
            .GLOBAL   DR_SHIFT1
            .GLOBAL   BYPASS_S1
            .GLOBREG  STATE_H
            .GLOBREG  STATE_L
            .GLOBREG  TMS_DELAY
            .GLOBREG  INSTRUCT_REG
;
SPIPC2      .EQU      P03E
;
;
DR_EXIT1    BTJO      #01,TMS_DELAY,NO_DELAY1
            MOV       #01,TMS_DELAY
;
DELAY1      CMP       #00H,INSTRUCT_REG   ; CHECK INSTRUCTION REGISTER
            JNZ       BYPASS_DELAY        ; IF NOT 00H, ASSUME BYPASS
;
SHIFT_DELAY CALL      DR_SHIFT1
            JMP       NO_DELAY1
;
BYPASS_DELAY CALL     BYPASS_S1
;
NO_DELAY1   MOVW      #DR_PAUSE,STATE_L   ; NEXT STATE IS DR_PAUSE
            MOVW      #DR_UPDATE,STATE_H  ; NEXT STATE IS DR_UPDATE
            RTS
;
            .END
```

-28-

```
            .text
            .GLOBAL DR_EXIT2
            .GLOBAL DR_SHIFT
            .GLOBAL DR_UPDATE
            .GLOBREG STATE_H
            .GLOBREG STATE_L
;
DR_EXIT2    MOVW    #DR_SHIFT,STATE_L       ; NEXT STATE IS DR_SHIFT
            MOVW    #DR_UPDATE,STATE_H      ; NEXT STATE IS DR_UPDATE
            RTS
;
            .END
```

-29-

```
        .text
        .GLOBAL DR_EXIT2
        .GLOBAL DR_PAUSE
        .GLOBREG STATE_H
        .GLOBREG STATE_L
;
DR_PAUSE        MOVW    #DR_PAUSE,STATE_L       ; NEXT STATE IS PAUSE
                MOVW    #DR_EXIT2,STATE_H       ; NEXT STATE IS DR_UPDATE
                RTS
;
                .END
```

-30-

```
        .text
        .GLOBAL IR_SCAN
        .GLOBAL DR_SCAN
        .GLOBAL DR_CAPTURE
        .GLOBREG STATE_L
        .GLOBREG STATE_H
;
SPIPC2  .EQU    P03E
;
;
DR_SCAN         MOVW    #DR_CAPTURE,STATE_L     ; NEXT STATE IS DR_SHIFT
                MOVW    #IR_SCAN,STATE_H        ; NEXT STATE IS IR_SCAN
                RTS
;
                .END
```

-31-

```
        .text
        .GLOBAL DR_EXIT1
        .GLOBAL DR_SHIFT
        .GLOBAL DR_SHIFT1
        .GLOBAL BYPASS_S1
        .GLOBREG STATE_L
        .GLOBREG STATE_H
        .GLOBREG OUTREG
        .GLOBREG INSTRUCT_REG
        .GLOBREG OUTREG
        .GLOBREG TMS_DELAY
SPIPC2          .EQU    P03E
INT3CTL         .EQU    P019

DR_SHIFT        CMP     #00H,INSTRUCT_REG   ; CHECK INSTRUCTION REGISTER
                JNZ     BYPASS_S            ; IF NOT 00H, ASSUME BYPASS
;
                BTJO    #01H,TMS_DELAY,OUTPUT ; IS THIS THE FIRST TIME
                CALL    DR_SHIFT1           ; INTO DR_SHIFT ? IF SO,
                JMP     OUTPUT              ; DON'T SHIFT !
;
;
;
; SHIFT REGISTER ROUTINE, BY ROTATING THROUGH CARRY THE LEAST SIGNIFICANT
; BIT OF EACH REGISTER CAN BE INPUT TO THE NEXT REGISTER IN THE CHAIN
; AUTOMATICALLY.
;
DR_SHIFT1       BTJO    #08H,SPIPC2,IN_ONE  ; COPY TDI (SPISOMI) TO CARRY
IN_ZERO         CLRC
                JMP     ROTATE
IN_ONE          SETC
ROTATE          RRC     R116                ; SHIFT STATE OF SPISOMI INTO
                RRC     R115                ; R116 AND SHIFT ALL REGISTER
                RRC     R114                ; TOWARDS LSB.
                RRC     R113
                RRC     R112
                RRC     R111
                RRC     R110
                RRC     R109
                RRC     R108
                RRC     R107
                RRC     R106
                RRC     R105
                RRC     R104
                RRC     R103
                RRC     R102
                RRC     R101                ; LAST SHIFT FEEDS LSB
                RRC     R100                ; INTO CARRY
                RTS
;
OUTPUT          BTJO    #01H,R100,OUT_ONE   ; PRE-LOAD OUTPUT REG WITH
OUT_ZERO        MOV     #010H,OUTREG        ; LSB AND TDO ENABLE BIT
                JMP     WAIT_NEG1           ; READY FOR -VE TCK EDGE
OUT_ONE         MOV     #050H,OUTREG        ;
;
WAIT_NEG1       MOV     #00H,TMS_DELAY
                MOV     #01H,INT3CTL        ; ENABLE TCK (INT3) FOR
                EINTH                       ; -VE EDGE DETECTION
                IDLE
;
                MOVW    #DR_SHIFT,STATE_L   ; NEXT STATE IS DR_SHIFT
                MOVW    #DR_EXIT1,STATE_H   ; NEXT STATE IS DR_EXIT1
                RTS
```

```
;
BYPASS_S       BTJO    #01H,TMS_DELAY,WAIT_NEG1 ; IS THIS THE FIRST TIME
               CALL    BYPASS_S1                ; INTO BYPASS ? IF SO,
               JMP     WAIT_NEG1                ; DON'T SHIFT !
;
;
;
BYPASS_S1      BTJO    #08H,SPIPC2,IN_ONE2      ; READ TDI (SPISOMI)
;
IN_ZERO2       MOV     #010H,OUTREG             ; LOAD '0' INTO OUTPUT REGIST
               RTS
;
IN_ONE2        MOV     #050H,OUTREG             ; LOAD '1' INTO OUTPUT REGIST
               RTS
;
               .END
```

```
        .text
        .GLOBAL DR_SCAN
        .GLOBAL RUN_TEST
        .GLOBAL DR_UPDATE
        .GLOBREG STATE_H
        .GLOBREG STATE_L
        .GLOBREG INSTRUCT_REG
;
SPIPC2   .EQU    P03E
;
;
DR_UPDATE       MOV     #00,SPIPC2      ; TRI-STATE TDO
;
                CMP     #00H,INSTRUCT_REG ; CHECK INSTRUCTION REGISTER
                JNZ     BYPASS            ; IF NOT 00H, ASSUME BYPASS
;
                MOV     R100,P022       ; PORT A I/O
                MOV     R101,P023       ; PORT A DDR
                MOV     R102,P026       ; PORT B I/O
                MOV     R103,P027       ; PORT B DDR
                MOV     R104,P02A       ; PORT C I/O
                MOV     R105,P02B       ; PORT C DDR
                MOV     R106,P02E       ; PORT D I/O
                MOV     R107,P02F       ; PORT D DDR
                MOV     R108,P04D       ; TIMER 1 I/O
                MOV     R109,P04E       ; TIMER 1 I/O
                MOV     R110,P06D       ; TIMER 2 I/O
                MOV     R111,P06E       ; TIMER 2 I/O
                MOV     R112,P05D       ; SCI I/O
                MOV     R113,P05E       ; SCI I/O
                MOV     R114,P07D       ; A-D I/P
                MOV     R115,P017       ; INT1 I/O
                MOV     R116,P018       ; INT2 I/O
;
;
BYPASS          MOVW    #RUN_TEST,STATE_L  ; NEXT STATE IS RUN_TEST
                MOVW    #DR_SCAN,STATE_H   ; NEXT STATE IS DR_SCAN
                RTS
;
                .END
```

-34-

```
        .text
        .GLOBAL IR_CAPTURE
        .GLOBAL IR_SHIFT
        .GLOBAL IR_EXIT1
        .GLOBREG STATE_H
        .GLOBREG STATE_L
        .GLOBREG INSTRUCT_REG
        .GLOBREG TMS_DELAY
;
IR_CAPTURE      MOV     #01H,TMS_DELAY
;
                MOV     #01H,INSTRUCT_REG       ; LOAD INSTRUCTION REG
                                                ; WITH 0000 0001
;
                MOVW    #IR_SHIFT,STATE_L       ; NEXT STATE IS IR_SHIFT
                MOVW    #IR_EXIT1,STATE_H       ; NEXT STATE IS IR_EXIT1
                RTS
;
                .END
```

-35-

```
            .text
            .GLOBAL  IR_EXIT1
            .GLOBAL  IR_PAUSE
            .GLOBAL  IR_UPDATE
            .GLOBAL  IR_SHIFT1
            .GLOBREG STATE_H
            .GLOBREG STATE_L
            .GLOBREG TMS_DELAY
;
SPIPC2   .EQU    P03E
;
;
IR_EXIT1       BTJO    #01,TMS_DELAY,NO_DELAY
EXIT1_DELAY    MOV     #01,TMS_DELAY
               CALL    IR_SHIFT1
;
NO_DELAY       MOVW    #IR_PAUSE,STATE_L       ; NEXT STATE IS IR_PAUSE
               MOVW    #IR_UPDATE,STATE_H      ; NEXT STATE IS IR_UPDATE
               RTS
;
               .END
```

-36-

```
        .text
        .GLOBAL IR_EXIT2
        .GLOBAL IR_SHIFT
        .GLOBAL IR_UPDATE
        .GLOBREG STATE_H
        .GLOBREG STATE_L
;
IR_EXIT2    MOVW    #IR_SHIFT,STATE_L     ; NEXT STATE IS IR_SHIFT
            MOVW    #IR_UPDATE,STATE_H    ; NEXT STATE IS IR_UPDATE
            RTS
;
            .END
```

-37-

```
        .text
        .GLOBAL IR_EXIT2
        .GLOBAL IR_PAUSE
        .GLOBREG STATE_H
        .GLOBREG STATE_L
;
IR_PAUSE        MOVW    #IR_PAUSE,STATE_L       ; NEXT STATE IS IR_PAUSE
                MOVW    #IR_EXIT2,STATE_H       ; NEXT STATE IS IR_UPDATE
                RTS
;
                .END
```

-38-

```
        .text
        .GLOBAL IR_SCAN
        .GLOBAL TL_RESET
        .GLOBAL IR_CAPTURE
        .GLOBREG STATE_L
        .GLOBREG STATE_H
        .GLOBREG TMS_DELAY
TMS_DELAY       .EQU    R57
;
SPIPC2  .EQU    P03E
;
;
IR_SCAN         MOVW    #IR_CAPTURE,STATE_L     ; NEXT STATE IS IR_SHIFT
                MOVW    #TL_RESET,STATE_H       ; NEXT STATE IS TL_RESET
                RTS
;
                .END
```

```
        .text
        .GLOBAL IR_EXIT1
        .GLOBAL IR_SHIFT
        .GLOBAL IR_SHIFT1
        .GLOBREG STATE_L
        .GLOBREG STATE_H
        .GLOBREG OUTREG
        .GLOBREG INSTRUCT_REG
        .GLOBREG TMS_DELAY
;
SPIPC2          .EQU        P03E
INT3CTL         .EQU        P019
;
;
IR_SHIFT        BTJO        #01H,TMS_DELAY,OUTPUT1  ; IS THIS THE FIRST TIME
                CALL        IR_SHIFT1               ; INTO IR_SHIFT ? IF SO,
                JMP         OUTPUT1                 ; DON'T SHIFT !
;
;
IR_SHIFT1       BTJO        #08H,SPIPC2,IN_ONE1     ; COPY TDI (SPISOMI) TO CARRY
IN_ZERO1        CLRC
                JMP         ROTATE_IR
IN_ONE1         SETC
ROTATE_IR       RRC         INSTRUCT_REG            ; SHIFT STATE OF TDI (SPISOMI
                RTS                                 ; INTO INSTRUCTION REGISTER R
;                                                     TOWARDS LSB.
;
OUTPUT1         BTJO        #01H,INSTRUCT_REG,OUT_ONE1  ; STATE OF IR LSB ?
;
OUT_ZERO1       MOV         #010H,OUTREG            ; COPY LSB TO O/P REG
                JMP         WAIT_NEG
OUT_ONE1        MOV         #050H,OUTREG
;
WAIT_NEG        MOV         #00H,TMS_DELAY          ; CLEAR TMS_DELAY
                MOV         #01H,INT3CTL            ; ENABLE TCK (INT3) FOR
                EINTH                               ; -VE EDGE DETECTION
                IDLE
;
                MOVW        #IR_SHIFT,STATE_L       ; NEXT STATE IS IR_SHIFT
                MOVW        #IR_EXIT1,STATE_H       ; NEXT STATE IS IR_EXIT1
                RTS
;
                .END
```

-40-

```
        .text
        .GLOBAL DR_SCAN
        .GLOBAL RUN_TEST
        .GLOBAL IR_UPDATE
        .GLOBREG STATE_H
        .GLOBREG STATE_L
;
SPIPC2  .EQU    P03E
;
IR_UPDATE       MOV     #00,SPIPC2              ; TRI-STATE TDO
;
                MOVW    #RUN_TEST,STATE_L       ; NEXT STATE IS RUN_TEST
                MOVW    #DR_SCAN,STATE_H        ; NEXT STATE IS IR_SCAN
                RTS
;
                .END
```

-41-

```
        .text
        .GLOBAL RUN_TEST
        .GLOBAL DR_SCAN
        .GLOBREG STATE_H
        .GLOBREG STATE_L
;
;
RUN_TEST      MOVW    #RUN_TEST,STATE_L      ; NEXT STATE IS RUN_TEST
              MOVW    #DR_SCAN,STATE_H       ; NEXT STATE IS DR_SCAN
              RTS
;
              .END
```

```
        .text
        .GLOBAL  START
        .GLOBAL  TCK
        .GLOBAL  TL_RESET
        .GLOBAL  RUN_TEST
        .GLOBREG STATE_H
        .GLOBREG STATE_L
        .GLOBREG OUTREG
        .GLOBREG INSTRUCT_REG
        .GLOBREG BYPASS_REG
;
INT3CTL         .EQU     P019
ADENA           .EQU     P07E
STATE_L         .EQU     R53
STATE_H         .EQU     R55
OUTREG          .EQU     R50
BYPASS_REG      .EQU     R51
INSTRUCT_REG    .EQU     R56
;
        .SECT    ROMCODE              ; THIS TEST RESIDES IN ROM
;       SOME KIND OF JTAG ENTRY TEST IS REQUIRED HERE
START   NOP
        NOP                           ; ALL I/O ASSUMED TRI-STATE
        NOP
        NOP
        BR       JTAG                 ; BRANCH TO JTAG CODE IN EEPROM
;
        .TEXT                         ; EEPROM STARTING ADDRESS ???
JTAG    MOV      #0FFH,ADENA          ; ENABLE A-D INPUTS
        MOVW     #TL_RESET,STATE_H    ; INITIALISE STATE TO TL_RESET
        MOVW     #RUN_TEST,STATE_L
        MOV      #014H,B
        LDSP                          ; INITIALISE STACK POINTER AT R20
        MOV      #00,P017             ; DISABLE ALL UNUSED INTS
        MOV      #00,P018
        MOV      #00,P04B
        MOV      #00,P06B
        MOV      #00,P055
        MOV      #00,P054
        MOV      #00,P031
        MOV      #00,P071
        MOV      #05H,INT3CTL         ; ENABLE TCK (INT3) +VE EDGE
        EINTH
WAIT    IDLE
        BR       WAIT                 ; WAIT FOR NEXT TCK
;
;
        .SECT    VECTORS
        .WORD    TCK                  ; INT3 VECTOR FOR TCK 7FF8,7FF9
        .WORD    START                ; INT2 VECTOR UNUSED
        .WORD    START                ; INT1 VECTOR UNUSED
        .WORD    START                ; RESET VECTOR TO ROM 7FFE,7FFF
;
        .END
```

```
                -43-
        .text
        .GLOBAL TCK
        .GLOBREG OUTREG
        .GLOBREG STATE_L
        .GLOBREG STATE_H
;
SPIPC1  .EQU    P03D
SPIPC2  .EQU    P03E
INT3CTL .EQU    P019
;
TCK             MOV     #05H,INT3CTL            ; CLEAR INT3
                BTJZ    #040H,INT3CTL,TCK_NEG   ; +VE OR -VE EDGE ON TCK (INT
;
TCK_POS         BTJO    #08H,SPIPC1,TMS_HI      ; CHECK STATE OF TMS (SPICLK)
;
TMS_LO          CALL    @STATE_L
                RTI
;
TMS_HI          CALL    @STATE_H                ; CALL NEXT STATE ROUTINE
                RTI
;
TCK_NEG         MOV     OUTREG,SPIPC2           ; OUTPUT BIT TO TDO (SPISIMO)
;
                MOV     #05,INT3CTL             ; RE-ARM TCK FOR +VE EDGE
                RTI
;
                .END
```

-44-

```
        .text
        .GLOBAL TL_RESET
        .GLOBAL RUN_TEST
        .GLOBREG STATE_L
        .GLOBREG STATE_H
        .GLOBREG INSTRUCT_REG
;
SPIPC2  .EQU    P03E
;
TL_RESET        MOV     #00,SPIPC2              ; TRI-STATE TDO
;
                MOV     #0FFH,INSTRUCT_REG      ; DEFAULT BY-PASS MODE MOVW    #RUN_TEST,STATE_L       ; NEXT STATE IS RUN_TEST
                MOVW    #TL_RESET,STATE_H       ; NEXT STATE IS TL_RESET
                RTS
;
                .END
```

-45-

```
SETUP.OBJ
STATE.OBJ
TL_RESET.OBJ
RUNTEST.OBJ
DR_CAPT.OBJ
DR_EXIT1.OBJ
DR_EXIT2.OBJ
DR_PAUSE.OBJ
DR_SCAN.OBJ
DR_SHIFT.OBJ
DR_UPDAT.OBJ
IR_CAPT.OBJ
IR_EXIT1.OBJ
IR_EXIT2.OBJ
IR_PAUSE.OBJ
IR_SCAN.OBJ
IR_SHIFT.OBJ
IR_UPDAT.OBJ

-o JTAG.OUT
-m JTAG.MAP

MEMORY
{
  RFILE:  origin =    02h  length = 0FEh
  ROM:    origin = 7000h   length = 1000h
  EEPROM: origin = 01F00h  length = 0100h
}
SECTIONS
{
    ROMCODE 07000h : { } > ROM
    .text 07700h : { } > ROM          /* WILL BE EEPROM !! */
    VECTORS 07FF8h : {} > ROM
}
```

```
****************************************************
TMS370 COFF Linker        , Version 3.40
****************************************************
Mon Mar 26 21:21:10 1990

OUTPUT FILE NAME:    <JTAG.OUT>
ENTRY POINT SYMBOL:  0

MEMORY CONFIGURATION name       origin      length      attributes
            --------   --------    ---------   ----------
            RFILE      00000002    0000000fe   RWIX
            EEPROM     00001f00    000000100   RWIX
            ROM        00007000    000001000   RWIX

SECTION ALLOCATION MAP output                                    attributes/
 section   page   origin      length       input sections
 -------   ----   ---------   ---------    ----------------
 ROMCODE    0     00007000    00000007
                  00007000    00000007     SETUP.OBJ (ROMCODE)

.text      0     00007700    0000020b
                  00007700    0000002f     SETUP.OBJ (.text)
                  0000772f    00000018     STATE.OBJ (.text)
                  00007747    0000000f     TL_RESET.OBJ (.text)
                  00007756    00000009     RUNTEST.OBJ (.text)
                  0000775f    00000049     DR_CAPT.OBJ (.text)
                  000077a8    0000001d     DR_EXIT1.OBJ (.text)
                  000077c5    00000009     DR_EXIT2.OBJ (.text)
                  000077ce    00000009     DR_PAUSE.OBJ (.text)
                  000077d7    00000009     DR_SCAN.OBJ (.text)
                  000077e0    0000006c     DR_SHIFT.OBJ (.text)
                  0000784c    00000044     DR_UPDAT.OBJ (.text)
                  00007890    0000000f     IR_CAPT.OBJ (.text)
                  0000789f    00000013     IR_EXIT1.OBJ (.text)
                  000078b2    00000009     IR_EXIT2.OBJ (.text)
                  000078bb    00000009     IR_PAUSE.OBJ (.text)
                  000078c4    00000009     IR_SCAN.OBJ (.text)
                  000078cd    00000032     IR_SHIFT.OBJ (.text)
                  000078ff    0000000c     IR_UPDAT.OBJ (.text)

VECTORS    0     00007ff8    00000008
                  00007ff8    00000008     SETUP.OBJ (VECTORS)

.data      0     00000000    00000000     UNINITIALIZED

.bss       0     00000000    00000000     UNINITIALIZED

GLOBAL SYMBOLS address   name                          address   name
--------  ----                          --------  ----
00000000  .bss                          00000000  edata
00000000  .data                         00000000  .data
00007700  .text                         00000000  end
00000033  BYPASS_REG                    00000000  .bss
00007840  BYPASS_S1                     00000032  OUTREG
0000775f  DR_CAPTURE                    00000033  BYPASS_REG
```

-47-

```
000077a8 DR_EXIT1              00000035 STATE_L
000077c5 DR_EXIT2              00000037 STATE_H
000077ce DR_PAUSE              00000038 INSTRUCT_REG
000077d7 DR_SCAN               00000039 TMS_DELAY
000077ee DR_SHIFT1             00007000 START
000077e0 DR_SHIFT              00007700 .text
0000784c DR_UPDATE             0000772f TCK
00000038 INSTRUCT_REG          00007747 TL_RESET
00007890 IR_CAPTURE            00007756 RUN_TEST
0000789f IR_EXIT1              0000775f DR_CAPTURE
000078b2 IR_EXIT2              000077a8 DR_EXIT1
000078bb IR_PAUSE              000077c5 DR_EXIT2
000078c4 IR_SCAN               000077ce DR_PAUSE
000078d6 IR_SHIFT1             000077d7 DR_SCAN
000078cd IR_SHIFT              000077e0 DR_SHIFT
000078ff IR_UPDATE             000077ee DR_SHIFT1
00000032 OUTREG                00007840 BYPASS_S1
00007756 RUN_TEST              0000784c DR_UPDATE
00007000 START                 00007890 IR_CAPTURE
00000037 STATE_H               0000789f IR_EXIT1
00000035 STATE_L               000078b2 IR_EXIT2
0000772f TCK                   000078bb IR_PAUSE
00007747 TL_RESET               000078c4 IR_SCAN
00000039 TMS_DELAY             000078cd IR_SHIFT
00000000 edata                 000078d6 IR_SHIFT1
00000000 end                   000078ff IR_UPDATE
0000790b etext                 0000790b etext

[33 symbols]
```

I claim:

1. A method of using a microprocessor chip having a plurality of ordinary microprocessor terminals but lacking predetermined dedicated boundary scan test bus terminals and boundary scan test circuits normally required to support a boundary scan test, to support and participate in a boundary scan test of component interconnections when installed in a product circuit with connections to other components having dedicated boundary scan test bus terminals and boundary scan test circuits, comprising the steps of:

restricting a first subset of the ordinary microprocessor terminals to use as terminals connectable to a JTAG test bus for the boundary scan test;

designating a second subset of the ordinary microprocessor terminals as testable as if provided with dedicated boundary scan test circuits; and loading and running a simulation program in the microprocessor instructing the microprocessor to (i) operate the first subset of terminals to simulate the predetermined dedicated boundary scan test bus terminals, and (ii) operate the second subset of terminals to simulate their being additionally provided with the predetermined dedicated boundary scan test circuits.

2. The method of claim 1 wherein the microprocessor chip has a non-volatile memory and the simulation program is stored in the non-volatile memory when the microprocessor chip is manufactured.

3. The method of claim 2 wherein the non-volatile memory is a ROM memory on board the microprocessor.

4. The method of claim 2 wherein the non-volatile memory is an EPROM memory on board the microprocessor.

5. The method of claim 4 wherein the simulation program is adapted to respond to erase itself in response to a predetermined instruction received via the terminals connectable to a JTAG test bus, whereby after the product circuit passes a boundary scan test of its component connections the space the simulation program occupies in the microprocessor's EPROM can be used to store other data.

6. The method of claim 2 wherein the microprocessor is manufactured with a non-volatile memory for storing microcode instructions and the simulation program is stored in the same memory during manufacture.

7. The method of claim 1 wherein the microprocessor has a RAM memory and address, data, and control buses coupled to terminals of the product circuit by which the simulation program is loaded in the microprocessor's RAM memory at the time of the boundary scan test.

8. The method of claim 1 wherein the boundary scan test is a JTAG test.

9. In a microprocessor chip having a plurality of ordinary microprocessor terminals but lacking predetermined dedicated boundary scan test circuits and test bus terminals normally required to support a boundary scan test, the improvement comprising:

a first subset of the ordinary microprocessor terminals programmable as terminals connectable to a JTAG test bus for the boundary scan test;

a second subset of the ordinary microprocessor terminals programmable as testable as if provided with dedicated boundary scan test circuits;

a non-volatile memory; and a simulation program stored in the non-volatile memory enabling the microprocessor to (i) operate the first subset of terminals to simulate the predetermined dedicated boundary scan test bus terminals, and (ii) operate the second subset of terminals to simulate their being additionally provided with the predetermined dedicated boundary scan test circuits;

wherein the microprocessor chip can support and participate in a boundary scan test of component interconnections when installed in a product circuit with connections to other components having dedicated boundary scan test circuits and terminals.

10. In a microprocessor chip having a plurality of ordinary microprocessor terminals but lacking predetermined dedicated boundary scan test circuits and test bus terminals normally required to support a boundary scan test, the improvement comprising:

a first subset of the ordinary microprocessor terminals programmable as terminals connectable to a JTAG test bus for the boundary scan test;

a second subset of the ordinary microprocessor terminals programmable as testable as if provided with dedicated boundary scan test circuits;

a non-volatile memory; and a simulation program stored in the non-volatile memory enabling the microprocessor to (i) operate the first subset of terminals to simulate the predetermined dedicated boundary scan test bus terminals, and (ii) operate the second subset of terminals to simulate their being additionally provided with the predetermined dedicated boundary scan test circuits.

* * * * *